(12) United States Patent
Kroon et al.

(10) Patent No.: US 9,395,548 B2
(45) Date of Patent: Jul. 19, 2016

(54) LIGHT OUTPUT PANEL AND DEVICE HAVING THE SAME

(75) Inventors: Bart Kroon, Eindhoven (NL); Mark Thomas Johnson, Arendonk (BE)

(73) Assignee: Koninklijke Philips N.V., Eindhoven (NL)

(*) Notice: Subject to any disclaimer, the term of this patent is extended or adjusted under 35 U.S.C. 154(b) by 269 days.

(21) Appl. No.: 14/009,188

(22) PCT Filed: Apr. 10, 2012

(86) PCT No.: PCT/IB2012/051746
§ 371 (c)(1),
(2), (4) Date: Oct. 1, 2013

(87) PCT Pub. No.: WO2012/143817
PCT Pub. Date: Oct. 26, 2012

(65) Prior Publication Data
US 2014/0029094 A1    Jan. 30, 2014

(30) Foreign Application Priority Data
Apr. 19, 2011  (EP) .................................... 11162994

(51) Int. Cl.
*G02B 27/22* (2006.01)
*G02B 27/02* (2006.01)
(Continued)

(52) U.S. Cl.
CPC ............ *G02B 27/225* (2013.01); *G09G 3/3208* (2013.01); *H01L 27/3218* (2013.01); *H04N 13/0404* (2013.01); *H04N 13/0422* (2013.01); *G09G 2300/0452* (2013.01)

(58) Field of Classification Search
CPC .... G02B 27/2214; G02B 27/22; G02B 3/005; G02B 27/0176; G02B 27/022; H04N 13/0404; H04N 13/0409; H04N 13/0422; H04N 13/0497; H04N 13/0452; H04N 13/0402; H04N 13/00; F21Y 2113/005; F21Y 2105/001

USPC ......... 359/462, 463, 464, 475, 477; 362/97.1, 362/97.2, 97.4, 559, 561, 227, 230, 231, 362/293
See application file for complete search history.

(56) References Cited

U.S. PATENT DOCUMENTS 5,953,148 A * 9/1999 Moseley ............ G02B 27/2214
    348/E13.004
6,064,424 A   5/2000 Van Berkel et al.
(Continued)

FOREIGN PATENT DOCUMENTS

DE      19920789 A1   5/2000
EP       0877966 B1   4/2004
(Continued)

OTHER PUBLICATIONS

Sandin et al, "The Varrier™ Autostereoscopic Virtual Reality Display", Electronic Visualization Laboratory, University of Illinois at Chicago, 2005, pp. 894-903.
(Continued)

*Primary Examiner* — Jade R Chwasz

(57) ABSTRACT

The invention provides a panel comprising a first light emitting area (1) for providing light of a first color and a second light emitting area (2) for providing light of a second color different from the first color, the first and second light emitting areas being separated from each other by a first spacing (3) along a first spacing axis (5) perpendicular to a normal of the panel, wherein the first spacing (3) is smaller than 5 micrometer. Preferably The Width (4) of the at least one of the light emitting areas is also smaller than 5 micrometer. As these spacings and/or dimensions approach the wavelength of light emitted by the light emitting areas, the boundaries between these areas become blurred or even the areas become indistinguishable from each other due to mixing. A Panel of the invention can be advantageously used in lighting and or display devices, in particular those that magnify the light emitting areas towards their users, such as autostereoscopic displays having lenticular lens arrangements.

20 Claims, 17 Drawing Sheets

63,67 69

(51) Int. Cl.
*G09G 3/32* (2016.01)
*H01L 27/32* (2006.01)
*H04N 13/04* (2006.01)

(56) References Cited

U.S. PATENT DOCUMENTS

| | | | |
|---|---|---|---|
| 6,069,650 | A | 5/2000 | Battersby |
| 6,231,201 | B1 | 5/2001 | Rupp |
| 7,990,496 | B2 | 8/2011 | Kwak et al. |
| 8,063,400 | B2 | 11/2011 | Sugimoto |
| 8,315,080 | B2 | 11/2012 | Park et al. |
| 2002/0005819 | A1* | 1/2002 | Ronzani ............ G02B 27/017 345/8 |
| 2003/0030370 | A1 | 2/2003 | Tada |
| 2005/0001787 | A1* | 1/2005 | Montgomery ......... G09G 3/003 345/6 |
| 2006/0098285 | A1 | 5/2006 | Woodgate et al. |
| 2006/0098296 | A1 | 5/2006 | Woodgate et al. |
| 2006/0103932 | A1* | 5/2006 | Relke ............... G02B 27/225 359/462 |
| 2006/0126049 | A1 | 6/2006 | Deguenther et al. |
| 2007/0001584 | A1 | 1/2007 | Lee et al. |
| 2007/0296911 | A1 | 12/2007 | Hong |
| 2008/0204550 | A1 | 8/2008 | De Zwart et al. |
| 2008/0316379 | A1 | 12/2008 | Zuidema et al. |
| 2010/0026920 | A1 | 2/2010 | Kim et al. |
| 2010/0328440 | A1 | 12/2010 | Willemsen |
| 2011/0012820 | A1 | 1/2011 | Kim et al. |

FOREIGN PATENT DOCUMENTS

| | | | |
|---|---|---|---|
| EP | 1566683 | A1 | 8/2005 |
| JP | 2004258365 | A | 9/2004 |
| JP | 2006278257 | A | 10/2006 |
| JP | 2007041580 | A | 2/2007 |
| JP | 2010002531 | A | 1/2010 |
| WO | 9723097 | A2 | 6/1997 |
| WO | 9821620 | A1 | 5/1998 |
| WO | 2008126049 | A1 | 10/2008 |
| WO | 2008130195 | A1 | 10/2008 |
| WO | 2009057020 | A1 | 5/2009 |

OTHER PUBLICATIONS

Park et al, "Data Driver Architecture and Driving Scheme of AMOLED Microdisplay for Mobile Projectors", IEEE Transactions on Consumer Electronics, vol. 55, No. 4, Nov. 1, 2009, pp. 2365-2371.

Ali et al, "59.2: High Performance Top Emitting OLED Devices", SID International Symposium, Society for Information Display, vol. XXXVIII, May 20, 2007, pp. 1691-1693.

Willemsen et al, "Fractional Viewing Systems to Reduce Banding in Lenticular Based 3D Displays" In Proc. Int. Disp. Workshops vol. 12, p. 1789-1792 (2005).

* cited by examiner

LIGHT OUTPUT PANEL AND DEVICE HAVING THE SAME

CROSS-REFERENCE TO PRIOR APPLICATIONS

This application is the U.S. National Phase application under U.S.C. §371 of International Application No. PCT/2012/051746, filed on Apr. 10, 2012, which claims priority to European Patent Application 11162994.5 filed April 19. These applications are hereby incorporated by reference herein.

FIELD OF THE INVENTION

This invention relates to panels for providing a light output for use in display and/or (large area) lighting devices and to a method of manufacture of such panels. The invention also relates to the use of such devices such as e.g. to a display or lighting device that includes one or more of such panels. Particularly, but not exclusively, the invention relates to such panels and the devices including them that optically magnify the output of the panels before providing it to a viewer. Even more particularly the invention relates to use of such panels in devices that are capable of providing dual view or autostereoscopic viewing mode, e.g. to display devices of the type that comprise a display panel having display pixels for producing a display and optical means for directing different views of an image to the different eyes of a viewer. The invention further relates to a method of manufacturing the panels and/or devices including or using such panels.

BACKGROUND OF THE INVENTION

Autostereoscopic displays may display two perspective (parallactic) views of an image such that a single viewer at a single position is able to perceive a stereoscopic image form one direction without the viewer having to wear special aid for distinguishing the different images between the correct eyes of the viewer. More advanced types of such displays may provide many more such views (e.g. 9 or 15) so that a viewer can observe several stereoscopic views from different directions or perspectives. Thus, the viewer can move relative to the display to experience a look around effect.

A known type of such autostereoscopic display device comprises a two-dimensional liquid crystal display (LCD) panel having a row and column array of display pixels acting as a spatial light modulator to produce the display of an image that may be a still image or be part of a video. An array of elongate lenticular lenses extending parallel to one another overlies the display pixel array, and the display pixels are observed through these lenticular lenses. The lenticular lenses are provided as a sheet of lenses. Each of the lenses is an elongated semi-cylindrical lens with a cylinder axis along the direction of elongation along which there is no lens surface curvature. The lenticular lenses extend in the column direction of the display panel with their cylinder axis parallel to the column direction and with each lenticular lens overlying a respective group of two or more adjacent columns of display pixels.

In an arrangement in which, for example, each lenticular lens is associated with two columns of display sub-pixels, the display sub-pixels in each column provide a vertical slice of a respective two-dimensional sub-image. The lenticular sheet directs these two slices and corresponding slices from the display sub-pixel columns associated with the other lenticular lenses, to the left and right eyes of a user positioned in front of the sheet, so that the user observes a single stereoscopic image. The sheet of lenticular lenses thus provides a view forming function through its light output directing function.

In other arrangements, each lenticular element is associated with a group of, say, four or more adjacent display sub-pixels in the row direction. Corresponding columns of display sub-pixels in each group are arranged appropriately to provide a vertical slice from a respective two-dimensional sub-image. As a user's head is moved from left to right a series of successive, different, stereoscopic images are perceived creating, for example, a look-around impression in a scene displayed on the device.

The above-described device provides an effective three-dimensional display. However, it will be appreciated that, in order to provide stereoscopic views, there is a necessary sacrifice in the horizontal resolution of the device. In the case of vertical lenticular lenses, the loss of resolution is entirely in the row (horizontal) direction. The use of slanted lenticular lenses as described in U.S. Pat. No. 6,064,424 allows the loss of resolution to be shared between the row and column directions.

There are other known autostereoscopic display designs. For example barriers can be used to block the passage of light, so that different pixels are projected to different eyes of the viewer. Also, other micro lens arrays can be used instead of lenticular lens arrays.

It is also known to provide switchable lenses in the sense that lens function can be switched off, so that a full resolution 2D mode can be provided in addition to the autostereoscopic (3D) mode.

SUMMARY OF THE INVENTION

A problem with some designs of autostereoscopic displays is that the lenticular lens arrangement for providing the views causes magnification of the pixels. Hence, by performing its view forming function, the lens arrangement optically magnifies the output of the display panel. In particular, due to the magnification, the (sub)-pixel structure (sub-pixel arrangement and/or areal shape and/or their mutual separation) can become visible, which can lead to the appearance of color break up in the stereoscopic image, as the different colors of each sub-pixel appear to originate from different parts of the 3D image and there are sharp color transitions over the boundaries in between sub-pixels.

It is an object of the invention to provide a panel and a device that includes such a panel which enable a reduction or prevention of the color breakup effect.

The invention is defined by the independent claims. The dependent claims define advantageous embodiments.

The invention solves the aforementioned problem by specifying a panel according to claim 1.

The first and second light emitting areas of the panel are arranged in the plane of the panel along at least one axis with a small spacing in between them. The small spacing according to the invention causes that the boundary between the first and second light emitting areas are less visible or blurred through mixing of the light of the boundary regions of the first and second light emitting areas. As the first and second light emitting areas provide light of different color, the differently colored light form the boundaries mix to give a mix color. Thus, following a line along the spacing axis that crosses the boundary between the first and second light emitting area, the color transition upon crossing is not abrupt, but smoothened. Thereby the color breakup effect is perceived as reduced.

Moreover, as the spacing values approach the wavelengths emitted by the light emitting areas, the mixed light cannot be optically resolved due to the Raleigh resolution criterion. The mixing is so to say 'irreversible' and optical magnification cannot undo such mixing of light. Thus, the boundary region where mixing occurs will still result in the magnified light emitting areas to show the mixed color smoothened boundary. Such a panel is thus particularly advantageous when optical magnification of the light emitting areas towards a user occurs.

The effect of the invention can be advantageously exploited in displays of numereous kinds including those that use magnifying instruments such as autostereoscopic displays and in particular lenticular lens based autostereoscopic displays.

The advantage of the invention is then further based on the recognition that nowadays the single-layer manufacturing precision is better than the wavelength of visible light, and this can be exploited to form sub-pixel structures shaped such that their emission appears smooth for any combination of primary colored sub-pixels. The resolution of photolithography depends on the wavelength of the light source. Similarly, the spatial resolution of a pattern of micro emitters depends on the wavelength of the emitted light. Optical magnification does not allow this resolution limit to be passed.

The mixing of light becomes more effective upon reduction of the spacing. Thus preferably the spacing is smaller than 3 micrometer, or even smaller than 1.5 micrometer. Most preferred is a spacing of 1 micrometer or smaller (e.g. 0.5 micrometer or smaller) as then the spacing is approaching the wavelength of light within the electromagnetic spectrum of interest with wavelength in between 0.2 and 1 micrometer. Preferred are values optimum for the visible light spectrum which is known to have light with a wavelength in between 0.39 to 0.75 micrometer (see description of the current application).

In an embodiment, at least one of the first and second light emitting areas has a width along the first spacing axis that is specified according to the invention. The smaller the width, the more light of the light emitting area having the small width is mixed with the light of (at least the boundary region of) the other light emitting area. This improves smoothness of color transition further. Preferably both the first and second light emitting areas have the small spacing according to the invention.

The effect improves upon decreasing the width value(s) in particular to values that approach the wavelength of the light emitted. Most preferred is that the width of the first and/or the second light emitting area along the first spacing axis is 1 micrometer or smaller or 0.5 micrometer or smaller as then the values approach the wavelengths of the electromagnetic spectrum of interest with wavelength in between 0.2 and 1 micrometer or even more preferred those of the visible light spectrum which is known to have light with a wavelength in between 0.39 to 0.75 micrometer (see description of the current application).

In another embodiment there is a third light emitting area that is spaced with a second spacing from the first light emitting area along a second spacing axis where the second spacing is smaller than 5 micrometer, or smaller than 3 micrometer, or smaller than 1.5 micrometer, or the same as, or smaller than 0.5 micrometer. According to the same mixing principles as explained above, mixing now occurs along two boundaries of the first light emitting area. If the first and second spacing axes make a non-zero (180) degree angle, the smoothening of color transition thus occurs in two directions in the plane of the panel. For an example of this embodiment see FIG. 2C. Alternatively, the first and second spacing may be defined along parallel first and second axes or even along the same spacing axis (the first and second spacing axis may be the same) so that smoothening of color transition occurs at least along the parallel axes or the single spacing axis. For examples of this embodiment see FIGS. 2A and 2B.

Preferably, the spacing axes may make a 90 degree angle such that the effect of the invention occurs in orthogonal directions. Numerous arrays of light emitting areas for filling a plane of a panel have area arrangements in rows and columns that are orthogonal.

A preferred option may be the embodiment where the second light emitting area is (at least partly) in between the first and third light emitting areas. Since the second spacing is defined according to the invention this implies that also the width of the second light emitting area that is at least partly in between the first and third light emitting areas is defined according to the invention, resulting in the light of the second light emitting area to be mixed entirely with that of at least the boundary regions of the first and third light emitting areas. For an example of this embodiment see FIG. 2B.

An even more preferred embodiment is one where in addition to the previous embodiment there are a fourth and fifth light emitting area such that the second light emitting area is also in between the fourth and fifth light emitting areas and the spacing between the fourth and fifth light emitting areas is defined along a spacing axis that is not parallel to the spacing axis of the second spacing to be smaller than 5 micrometer, or smaller than 3 micrometer, or smaller than 1.5 micrometer, or the same as, or smaller than 0.5 micrometer. As explained for the one dimensional case of the previous embodiment, now the light of the second light emitting area is also completely mixed with the light of the fourth and fifth light emitting areas so that the second light emitting area is completely indistinguishable form the surrounding ones. For an example of this embodiment see FIG. 5.

In an embodiment at least the first light emitting area, the second light emitting area and the third light emitting area are for providing light of mutually different colors. The boundary between a set of differently colored light emitting areas is now smoothened and can make a color chosen from the 'full' color spectrum. To this end the mutually different colors may be chosen from appropriate color systems such as e.g. Red, Green, Blue system, or Cyan, Magenta, Yellow system either of them augmented with black and/or white.

In an embodiment, the first and third light emitting elements are for providing light of the same color. Thus, the boundary between equally colored light emitting areas is now smoothened along at least one direction in the plane of the panel.

In an embodiment at least the first light emitting area, the third light emitting area and the fourth light emitting area are for providing light of the same color. The boundary between equally colored light emitting areas along two differently oriented axes is now smoothened.

In a preferred embodiment the light emitting areas have any one of a triangular, quadrangular, or hexagonal shape. With these shapes the plane of the panel can be regularly filled. Preferably all shapes are the same and also have the same dimensions. Alternatively other plane filling patterns may be used where there are different types of shapes and/or dimensions combined.

In one alternative embodiment, the light emitting areas have the shape of a convex polygon. A convex polygon is a simple polygon whose interior is a convex set. A simple polygon is strictly convex if every internal angle is strictly less than 180 degrees. Equivalently, a polygon is strictly convex if every line segment between two nonadjacent vertices of the polygon is strictly interior to the polygon except at its endpoints. The opposite of a convex polygon would be a concave polygon.

The above shapes and/or dimensions for the light emitting areas allow filling of the panel plane with light emitting elements such that color breakup is reduced or prevented across the plane of the panel that is filled.

The advantage holds for a panel that is used as such, i.e. that is observed by a user without further manipulation of panel output. However, the advantage is even better for a panel that is used in combination with magnification means or a magnification arrangement that cause the light emitting areas to be magnified towards users. Such means may be lenses or prisms placed behind (panel is then in between the means and the user) or preferably before (means are then in between panel and user) the panel. However other such magnifying optical means are not excluded. These magnification means or the magnification arrangement may be part of the panel to the extent that it is attached to the panel, or is integrated with the panel, or is separate from the panel, but used in conjunction with the panel.

The panel of the invention is particularly advantageous when used as a display panel comprising pixels, where each pixel comprises a first sub-pixel and a second sub-pixel and wherein the first sub-pixel comprises the first light emitting area and the second sub-pixel comprises the second light emitting area. Throughout this invention, a pixel is defined as part of the panel. Thus, a pixel is defined as the smallest unit of the panel for providing a single image point of an image to a viewer. The sub-pixel is defined as the smallest unit of the panel for providing a part of the single image point to the viewer. Preferably, and according to current practice, a sub-pixel provides a single color to the pixel such that the sub-pixels of a pixel provide different colors to the pixel. However, alternatively, a sub-pixel may also provide only a single part of the single image point such that different sub-pixels of a pixel provide different parts of the single image points. These parts may then be of the same color the same color, or of different colors.

Display panels typically have multiple pixels that each provides an image point to a viewer. Moreover in the majority of cases each pixel comprises multiple single color sub-pixels for giving the pixel a full color capability. Since the first light emitting area is part of the first sub-pixel of a pixel and the second light emitting area is part of the second light emitting area of the pixel, the first and second sub-pixels of the panel enjoy the benefits of the invention as they are now spaced and/or dimensioned according to the invention. Hence, color breakup across the image displayed by the panel may be reduced or even eliminated.

The pixels and/or sub-pixels may be arranged in rows and columns. These are preferably orthogonal, but may also have other relative orientation.

In an embodiment the display panel has pixels wherein the first sub-pixel comprises a plurality of first light emitting areas and wherein the second sub-pixel comprises a plurality of second light emitting areas. The light emitting areas have a spacing and possibly also a dimension that is limited by the inventions to very small values below 5 micrometer. However, it may be desirable to have a pixel area on the panel that exceeds these values e.g. because of image content of a particular (digital) resolution in relation to the complete display panel area. Hence in that case it is advantageous if the there are multiple light emitting areas per (sub)-pixel. Thus, the first and second light emitting areas preferably are interlaced in a regular way. For an example see FIGS. 8B to 8E. The plurality of light emitting areas of one sub-pixel preferably provides the same color. In an alternative, each sub-pixel may comprise a repeating pattern of light emitting areas such that the spacing between the light emitting areas is related to the wavelength of the light emitted by the light emitting areas such that the larger the wavelength is, the larger the spacing between the light emitting areas emitting the light of this wavelength.

The display panel according to the embodiments defined herein before has pixels in which due to the light emitting area specification according to the invention, the individual subpixels have smooth color transition on going from one to another, or may not be optically distinguishable at all in the emitted colors.

In an embodiment, the display panel of any of the previous embodiments has pixels wherein each of these pixel covers a single continuous panel area. Thus, there are no parts of a continuous panel area of one pixel enclosed by a continuous panel area of another pixel. Preferably, the shape of the continuous panel area is that of a convex polygon. See hereinbefore for a definition of convex polygon. Preferred convex polygon shapes are triangles, quadrangles such as rectangles or squares, or hexagons. With these continuous panel area shapes the plane of the panel can be regularly filled. Preferably all shapes are the same and also have the same dimensions. Alternatively other plane filling patterns may be used where there are different types of shapes and/or dimensions combined.

In an embodiment a display panel has pixels with subpixels wherein the first sub-pixel comprises a plurality of first light emitting areas and wherein the second sub-pixel comprises a plurality of second light emitting areas, and wherein a pixel covers a first continuous panel area and a second continuous panel area where the first continuous panel area is not contiguous with the second continuous panel area, and wherein the first continuous panel area and the second continuous panel area each comprise a first light emitting area of the first sub-pixel and a second light emitting area of the second sub-pixel. In this embodiment pixel is defined to cover two continuous areas on the panel that are not contiguous. In addition, each of these continuous areas has light emitting areas of one and the same sub-pixel enclosed. Hence in this embodiment there is a sub-pixel distributed of multiple continuous panel areas. Such a display panel can be used for autostereoscopic displays to provide autostereoscopic imaging without the color breakup in the stereoscopic views of the display. Examples of such panels are described with reference to FIGS. 14 and 16. Preferably, the first continuous panel area and/or the second continuous panel area comprise a plurality of first and/or second light emitting areas. This enables to choose the size of the areas independent of the light emitting area spacings and dimensions. Within a continuous panel area the order arrangement of light emitting areas of the different colors may be chosen as desired. However, preferably, this order is the same in all continuous panel areas. More preferably, the order repeats over the entire display panel.

In an embodiment, a display panel as described herein before including the first sub-pixel comprising a plurality of first light emitting areas and including the second sub-pixel comprising a plurality of second light emitting areas, is one wherein the light emitting areas of the first sub-pixel are interconnected such that they are simultaneously addressable with one interconnect line and/or the light emitting areas of the second sub-pixel are interconnected such that they are simultaneously addressable with one interconnect line. In this embodiment the light emitting areas of a sub-pixel are interconnected. Thus, although there are many light emitting areas per sub-pixel, they do not require the same multiplicity of addressing lines and connections. Each light emitting area can be driven with the same information (e.g. voltage or current) to represent the sub-pixel's intensity value.

In an embodiment of a display panel having first and second continuous but non-contiguous panel areas, the light emitting areas of each of the first sub-pixel and the second sub-pixel that are covered by the first continuous panel area of a pixel are interconnected such that they are simultaneously addressable with one interconnect line and wherein the light emitting areas of each of the first sub-pixel and the second sub-pixel covered by the second continuous area of the pixel are interconnected such that they are simultaneously addressable with one interconnect line. In this embodiment the light emitting areas of a sub-pixel that lie within a continuous area of a pixel are interconnected. Although this requires more interconnect lines than in the previous embodiment, this has the advantage that the buildup of a pixel may be redefined. More specifically, while in a first mode of operation of the panel a pixel may be covering two or more continuous panel areas of which a first and second one are non-contiguous, in another mode of operation, the pixel may cover two or more continuous panel areas of which at least one differs from the ones of the first mode of operation. This feature is advantageous when the first mode of operation is utilized for autostereoscopic display (3D display) or dual view display while the second mode is used for regular 2D display or a mode of autostereoscopic display that differs from the first mode of autostereoscopic display or the dual view display. In particular, the first mode of autostereoscopic display may require pixels that cover continuous areas that are mutually separated by continuous areas of at least three other pixels, while in the 2D mode the pixel may be defined to be covering only one or multiple, but contiguous continuous areas.

Dual view display is defined as display of two interlaced images over the panel such that each of at least two viewers can observe only one of the interlaced images without having to wear image separation means before the eyes. This, just like autostereoscopic display requires the use of distributed sub-pixels and pixels with non-contiguous areas across the display panel.

The panel of the invention may be used for lighting and thus may be part of a lighting device or system. Especially large area lighting may benefit from the invention as then surfaces with smooth color transitions can be made The panel of the invention and in particular the display panels according to the invention as described herein before can be advantageously used for display purposes. Hence they may be part of an electronic picture frame, a projection display device, a near eye display device, a multi-view display device, a dual-view display device, a stereoscopic display device or an autostereoscopic display device. Any one of these devices may also have the optical magnification means for optically magnifying the output of the panel towards the users of the device. These means may be inherent in the view forming arrangement of any one of the multi-view displays.

Optical magnification occurs in projection displays where a regular two dimensional image may be enlarged on a screen using optics such as lenses or prisms etc. Alternatively, in some designs of multi-view displays (which include dual or triple view displays or autostereoscopic displays), optical magnification due to the view forming arrangement (including lenticular lenses, prism arrays, micro lens arrays or even parallax barriers) also occurs possibly even as an unwanted side effect.

Thus, a preferred display according to the invention is a multi-view display that includes a view forming arrangement for directing at least a first sub-set of pixels (defined on the display panel) in a first view and a second sub-set of pixels different from the first set of pixels into a second view. The pixels will be magnified due to the view forming arrangement. The view may be a view for a particular eye of a viewer such that the viewer receives different views in the different eyes like in an autostereoscopic display where the first and second views are used to provide parallactic images to the different eyes of the viewer. Alternatively the first view may be for both eyes of one particular viewer while the second view is for both eyes of another viewer like in a dual view display where the first view is used to provide a particular image to the first viewer and the second view is used to provide another image to the other viewer. The views al always provided in different directions within a field of view of a multi-view display device.

The view forming arrangement may comprise an array of lenticular lenses. Preferably these are an array of elongate lenticular lenses with a semi-cylindrical shape (or other lens curved shape) extending parallel to one another. The array overlies the display panel and the display pixels are observed through these lenticular lenses. The lenses may be distanced from the display panel such that the pixels substantially lie in the focal plane of the lenticular lens array.

Each of the lenses preferably is an elongated semi-cylindrical lens with a cylinder axis along the direction of elongation along which there is no lens surface curvature. The display panel may have pixels that comprise continuous areas arranged in rows and columns where it is preferred that these rows and columns are orthogonal. The lenticular lenses may extend in the column direction of the display panel with their cylinder axis parallel to the column direction and with each lenticular lens overlying a respective group of two or more adjacent columns of display pixels. Preferably the lenticular lenses extend in the column direction of the display panel with their cylinder axis makes a slant angle to the column direction and with each lenticular lens overlying a respective group of two or more adjacent columns of display pixels. The slant angle is such that at least two continuous panel areas of a pixel can be chosen to lie in different rows. This is advantageous for the shape of a unit picture element in a view which can become more square like instead of elongated. An example is described with reference to FIG. 16.

The light emitting areas of the invention preferably are part of directly emitting elements. Preferably such an element is a Light Emitting Diode (LED) or an Organic Light Emitting Diode (OLED).

Preferably the method comprises:
defining a pattern of drive electrodes having dimensions corresponding to the desired sub-pixel dimensions;
using the drive electrode pattern as a mask in a process which forms dams between the drive electrodes; and
providing the space between the dams with light emitting element material, thereby forming sub-pixels over the drive electrodes.

This uses the electrode pattern as a mask for forming channels (between the dams) to receive the light emitting element material. Providing the space between the dams with light emitting element material preferably comprises printing Organic Light Emitting Diode material.

The method can further comprise defining printing pads using the dam structure, which printing pads are coupled to respective sub-pixels, and wherein the printing is to the printing pads. This simplifies the required printing process.

BRIEF DESCRIPTION OF THE DRAWINGS

Examples of the invention will now be described in detail with reference to the accompanying drawings, in which.

DETAILED DESCRIPTION OF THE EMBODIMENTS

Details of the invention will now be described with regard to examples. First, some example schematic panel layouts for light emitting areas, as depicted in FIGS. 1 to 5, will be described, with which it is further elucidated how the invention can be employed in general for panels and the devices making use of such panels. In the figures, the same reference numbers indicate similar features. In these examples, unless otherwise indicated a panel may be construed as having some kind of plane with light emitting areas distributed over this plane that are part of one or more light emitting elements. These light emitting elements are capable of providing light when driven by driving means (usually electronic or Integrated Circuit devices) and they provide their light with the light emitting areas. Such a light emitting element may preferably be a Light Emitting Diode (LED) or an Organic Light Emitting Diode (OLED), but other light emitting elements are not excluded. The panel may include the driving means, e.g. in the form of electronics such as integrated circuits that provide appropriate voltages or currents for driving of such light emitting elements. Alternatively, the panel may have only the elements and connections suitable to connect them to external driving means. The driving means in the form of electronics are well known in the art for lighting applications as well as for display applications and will, for sake of brevity, not be described in the current application.

Figure 1:
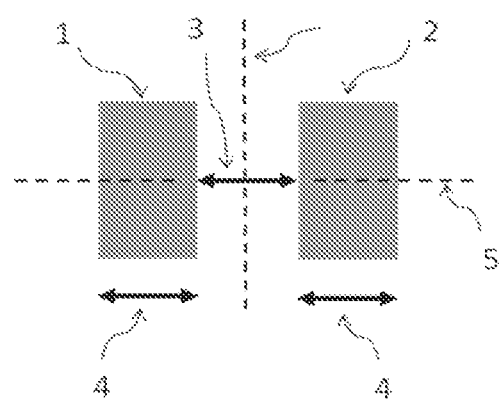
FIGS. 1, 2A, 2B, 2C, 3, 4, 5A and 5B are schematic drawings of panels having light emitting elements according to the invention.

FIG. 1 represents a plan view of an example panel according to the invention. The panel (drawn in the plane of paper) has a first 1 and second 2 light emitting area separated from each other with a first spacing 3 along the spacing axis 5. The first spacing 3 is chosen to be any one of: smaller than 5, smaller than 3, smaller than 1.5, smaller than or equal to 0.5 or even smaller than or equal to 0.25 micrometer.

Since the invention is of interest to applications emitting electromagnetic radiation with wavelength $\lambda$ roughly between 0.2 and 1 micrometer. The value specified here above for the spacing 3 relates to this wavelength range. It is preferred that the invention is optimum for applications that serve the human eye. Hence, such a panel operates preferably in a wavelength region that is in between 0.39 to 0.75 micrometer, which region then represents the visible light spectrum. Light with a wavelength of 0.5 micrometer may be used as a representative wavelength value within this spectrum to base the feature sizes according to the invention on. Thus e.g. the values of spacings (like spacing 3) and widths, heights, or other feature sizes (dimensions) of light emitting areas may be indicated as a factor c times the wavelength lambda or the representative wavelength value. The factor may be an integer value ranging from 10 to 1 or a non-integer value such as 0.75, 0.5 or 0.25. Preferably, the value of the spacings and/or the feature sizes of the light emitting areas is then equal to or lower than 1 micrometer, or even equal to or lower than 0.5 micrometer, as such spacings and/or feature sizes approach the representative value of the visible spectrum to within a factor of 2, 1 or even less, thus greatly increasing the mixing of the output light.

In the current example of FIG. 1 the spacing 3 specified according to the invention results in blurring of the boundary between the first 1 and second area 2 in the region where the spacing is according to the invention. This is due to the irreversible mixing of the light as in this region the Raleigh radiation resolution criterion is applicable. This does not necessarily mean however that all light of the areas 1 and 2 thus mixes. After all, the widths of the first and second light emitting areas 1 and 2, as measured along e.g. the spacing axis 5, may be far larger than the values specified for the spacing 3, such that light stemming from more distant parts of the first and second light emitting areas may not mix according to the invention. Nevertheless, the boundaries of such areas will be mixed and thus blurred providing a smooth transition when following a line crossing the boundary upon going from one to the next area.

In a preferred alternative of the example of FIG. 1, the first and second light emitting areas 1 and 2 may have a feature size (width 4 along e.g. the axis 5) that is chosen to be any one of: smaller than 5, smaller than 3, smaller than 1.5, smaller than or equal to 0.5 or even smaller than or equal to 0.25 micrometer. In this case, with ever decreasing feature size (width 4), ever larger parts of the areas 1 and 2 of the one or more light emitting elements get mixed with each other. Ultimately, e.g. when the feature sizes (widths 4) of the light emitting areas 1 and 2 become as small as the wavelength of the emitted light, full mixing of the outputs may occur to such an extent that these cannot be observed individually anymore even after optical magnification.

Additional dimensions of a light emitting area may be their height.

Figure 2A:
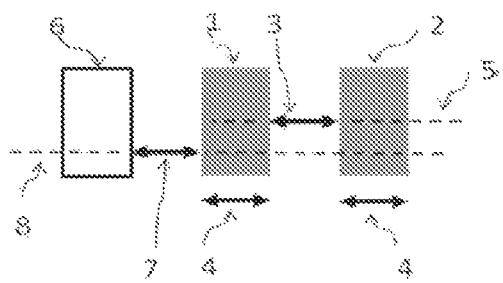
Figure 2B:
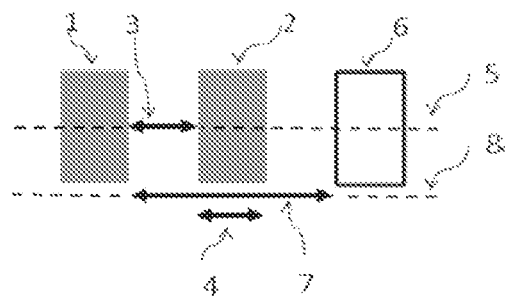
Figure 2C:
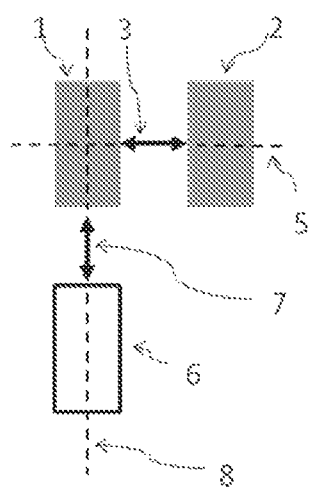

In an example as represented by FIGS. 2A to 2C, the panel of FIG. 1 is reproduced where the panel further comprises a third light emitting area 6 that is spaced from the first light emitting area 1 with a second spacing 7 along a spacing axis 8. The second spacing is chosen to be any one of: smaller than 5, smaller than 3, smaller than 1.5, smaller than or equal to 0.5 or even smaller than or equal to 0.25 micrometer. The spacing axis 8 may be parallel to the spacing axis 5 as in the embodiments of FIGS. 2A and 2B, or these spacing axes may not be parallel as in the embodiment of FIG. 2C.

In the embodiment of FIG. 2A, light emitting area 1 is in between the others and the spacings 3, 7 and the width 4 may be defined independently from each other, giving freedom of design for light emitting areas on the panel while providing the advantage of the invention.

In the preferred embodiment of FIG. 2B, the second light emitting area 2 is situated in between the first and third light emitting areas 1 and 6. As a result of the specification of values for the second spacing 7, the boundaries of the first light emitting area 1 and the third light emitting area 6 will mix and be blurred or be not sharp. In addition, since the spacings 3 and 7 are both defined with regard to the first light emitting area 1, the value for the spacing 7 determines the upper boundary for values of the sum of the first spacing 3 and the width 4 such that both the first spacing 3 and the width 4 will fulfill the requirements for mixing of the light of the entire light emitting area 2 into the borders of the light emitting areas 1 and 3. This is especially the case when the second spacing is smaller than 1.5 micrometer.

The light emitting area 2 may thus not be separately observed but entirely mixed, especially when the spacing 7 becomes smaller than 1.5 micrometer as then it approaches the wavelengths of light of the visible spectrum emitted, e.g. 2 to 1 times the representative wavelength of visible light.

The second light emitting area 2 is drawn to be entirely in between the light emitting areas 1 and 6. However, it may also be only partly in between these light emitting areas; e.g. when it is offset with regard to the others in a direction vertical to the axis 5 or 8. In that case the mixing applies to at least this part that is in between the areas. Thus a smooth transition of light output is observed in going from light emitting areas 1 to 6 via 2. Note that the first spacing 3 and the width 4 can be freely chosen as long as their sum adds up to the value of the second spacing 7 for this embodiment of the example.

In the embodiment of FIG. 2C the spacing axes 5 and 8 make any angle different from zero. The spacing axes 5 and 8 could for example make angels of 30, 45, 60, or 90 degrees, but other values are not excluded. In FIG. 2C axes 5 and 8 are orthogonal while in e.g. FIG. 4 these axes are approximately 60 degrees. Specifying the spacings 3 and 7 for non-parallel spacing axes 5 and 8 results in mixing of light in different directions over the panel, thus blurring area borders in the different directions over the panel in just the same way as described for the embodiment of FIG. 1. Accordingly smooth output transition and/or smooth color transition may be obtained not in only one direction but over an area of the panel.

Figure 3:
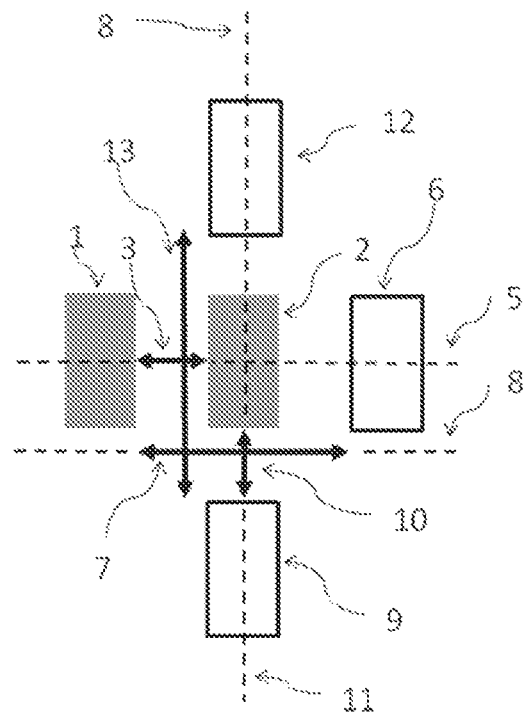

FIG. 3 shows a preferred embodiment in that the mixing of the second light emitting area 2 with at least parts of the light emitting areas 1 and 6 as described for the embodiment of FIG. 2B now also occurs along the spacing axis 11. Thus, the additional fourth light emitting area 9 is spaced from the second light emitting area 2 with a third spacing 10 along spacing axis 11. The fifth light emitting area 12 is spaced from the fourth light emitting area 9 with the fourth spacing 13 along spacing axis 14. The spacing 10 (and thus also 13) is again chosen to be any one of: smaller than 5, smaller than 3, smaller than 1.5, smaller than or equal to 0.5 or even smaller than or equal to 0.25 micrometer. The second light emitting area is in between the fourth and fifth light emitting areas 9 and 12. Thus, for similar reasons as described for the embodiment of FIG. 2B, the second light emitting area 2 may now be entirely mixed with neighboring areas in two directions, especially when the spacings 7 and 13 become as low as the wavelength of light emitted. The spacing axes 11 and 14 are parallel in the case of FIG. 3.

Spacings and dimensions of the light emitting areas of the examples above may be chosen within the definition of the invention. However, preferred embodiments have a the spacing 7 and/or spacing 13 below 2 micrometer as then transitions will be smoothened over substantially the whole area of the light emitting area 2 along at least one of the axes 5 or 11. Even better would be that such spacing is below 1 or even 0.5 micrometer. Light output in the transition region will then be substantially uniform.

Note that in any of the above examples spacings 3 and/or 10 may be substantially zero. In this way the entire panel area provides light output and there are no dark regions that may give an output intensity variation of any kind. Thus preferably the spacing between neighboring light emitting elements approaches, or is zero while the feature sizes such a width and height of the light emitting is areas is chosen to be any one of: smaller than 5, smaller than 3, smaller than 1.5, smaller than or equal to 0.5 or even smaller than or equal to 0.25 micrometer. This makes that all panel area is used for providing light while optimum mixing of borders and areas is achieved.

In an example, a panel may have a plurality of first and second light emitting areas and, if applicable, may also have a plurality of third, fourth and fifth light emitting areas. In a panel of the invention a group of pixels may have the essential features of the invention as defined by any of the claims. At the same time another group of pixels that is only partly or entirely different from the first group may also have the essential features according to any one of the claims. Examples of this will be described herein below.

The shape of one or more of the light emitting areas according to the invention, e.g. of those of the FIGS. 1 to 5, may be chosen as desired. However, certain shapes will be advantageous in relation to the spacings specified, especially when the panel has a plurality of light emitting areas that is used to fill a larger area on the panel (e.g. a display panel with an array of pixels with light emitting areas.

Figure 4:
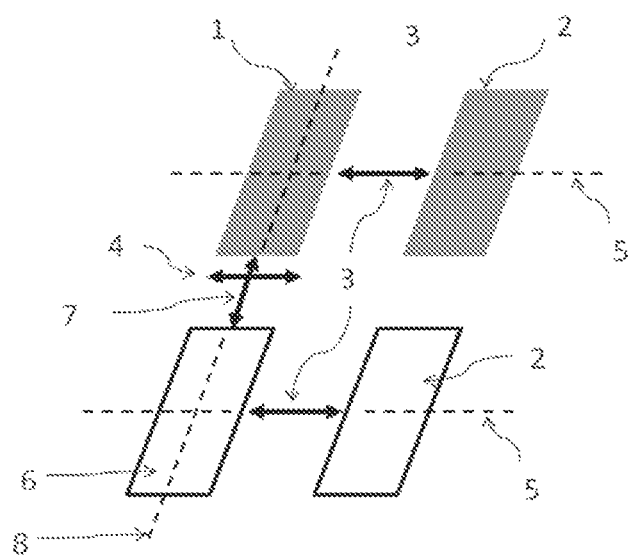

In one example, the light emitting areas have shapes with which it is possible to fill a plane or curved plane regularly. Such light emitting areas, when all having the same shape, may be for example triangular, quadrangular (diamond shaped, rhomboid, rectangular or square), or hexagonal (regular hexagonal with same length side or irregular hexagonal with different length sides). FIG. 4 provides an example of a panel with rhomboidal light emitting areas. Alternatively there may be multiple types of shapes among all light emitting areas, i.e. there may be squares in combination with rectangles, triangles in combination with rhomboids, or any other combination that can be plane filling without leaving gaps etc. Those shapes and distributions that result in borders of neighboring light emitting areas to run parallel to each other are advantageous, as mixing with neighbors is then more uniform.

Figure 5A:
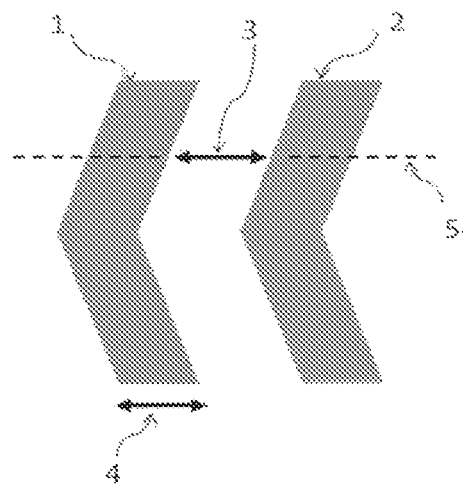
Figure 5B:
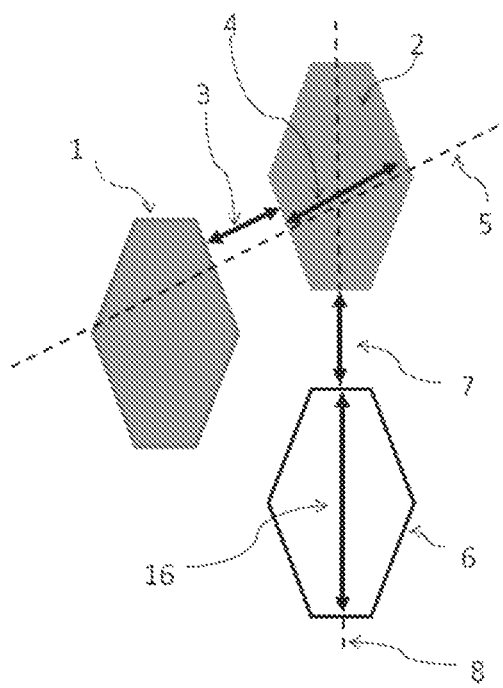

The light emitting areas may be in the form of arrows as in FIG. 5A, which in effect are shapes resulting from combination of diamondoids as drawn in FIG. 4. FIG. 5B shows a panel with hexagonally shaped light emitting areas and the way spacings and widths or height 16 of areas can be determined or defined. In this case het hexagons are irregular as two sides (up and down) are shorter than the four others. Regular hexagons may be used in similar pattern.

In the invention and the embodiments of FIGS. 1 to 5, the colors of light emitting areas 1 and 2 are different and at least two colors and their mixing results can be provided by the panel. Transition of color going from the one color to the other is smoothened due to the blurring. Preferably the panel comprises at least three differently colored light emitting areas (for example the first second and third light emitting areas) with which a full color spectrum can be generated. Such colors may be Red, Green, Blue (RGB) with or without yellow (Y) or white (W), or Cyan, Magenta, Yellow (CMY) with or without black (B). Such colors are sometimes referred to as primary colors.

In alternative examples, the panel is arranged as in FIGS. 2 to 5 and at least the first and third light emitting areas are for providing light of the same color. Hence, the boundary between equally colored light emitting areas is now blurred beyond resolution by optics along at least the axis 5. In an embodiment where also the fourth light emitting element 9 has the same color as the first and third light emitting elements 1 and 6, the equally colored light emitting area is extended along the axis 11.

The panels described above can be used in lighting devices such as lamps. They will be especially advantageous in large area lighting devices where uniform lighting over larger areas is required possibly in combination with color control over the large area. Thus, e.g. smooth transition of color over a large area may be accomplished.

Alternatively the panels according to the invention can be advantageously used in display devices. Display devices typically are capable of providing an image or picture to a viewer with high (digital) resolution. To this end these devices generally have panels where pixels are defined each of which is subdivided into sub-pixels e.g. for providing color to the pixels.

In a color display, the pixel of a display (panel) defines the smallest unit that can be addressed for representing a digital image (spatial) point or element of a picture or image (with full color if appropriate). The pixels of the display (panel) determine the resolution with which the picture/image is displayed. The sub-pixel of the pixel are the smallest unit for providing one color to the pixel. Together the sub-pixels of the pixel give the pixel its capability of providing a full colored picture or image element. The addressing of pixels and sub-pixels is generally done using the driving means of the panel.

Pixels may be organized in arrays with rows and columns. These rows and columns do not need to be orthogonal, but in practice often are. In most pixel/sub-pixel layouts also the sub-pixels are organized in rows and columns thus giving columns of sub-pixels with the same color.

The details of the invention when used for displays, and in particular displays with magnifying optics in front of the panel such as e.g. a lenticular lens based autostereoscopic displays, will be further described here below. The mixing of light output of light emitting areas will be in accordance with the principles explained with reference to FIGS. 1 to 5.

Figure 8A:
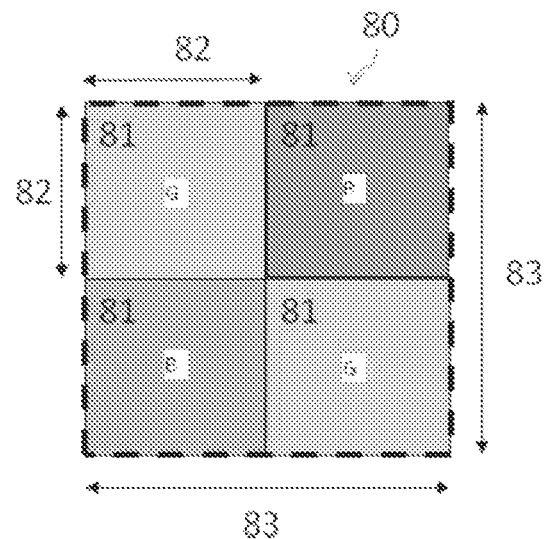
FIGS. 8A and 8B are used to show the difference between a conventional (sub)-pixel pattern as in FIG. 8A and one according to the invention as in FIG. 8B.

FIG. 8A shows the color pixel 80 of a regular pixel pattern of a display panel. The pixel has dimensions (width and height) 83. In this case every color pixel 80 has four single color (primary color) sub-pixels 81; two green (G) ones, a blue (B) one and a red (R) one. The area of each sub-pixel 81 is square with dimensions (height and width) 82, where the dimension 82 in this case is half the length of the dimension 83. The pattern basically is a scaled Bayer pattern (as used by digital cameras). Only one color pixel 80 of the pattern is shown and the panel pattern is easily reconstructed by translation of the pixels along the directions in which the dimensions 83 are defined. Thus, the color pixel 80 is part of a regular repeating pattern across the display panel consisting of rows and columns (not shown) of pixels.

In the embodiment of FIG. 8A, when representing a prior art display panel, the dimensions 83 of the pixels 80 for instance may be of the order of 480 micrometer for a 42" 1080p High Definition Television (HDTV) or 100 micrometer for a high-end mobile phone. Usually, in such displays a black matrix is present around light emitting parts of the pixels, of which the width may be in the 10 to 20 micrometer range. Black matrix thus determines spacing between (sub)-pixels and therewith between light emitting areas of the sub-pixels to be in this 10 to 20 micrometer range.

In the prior art display panel of the embodiment of FIG. 8A, three addressing (driving) connections are used per pixel 80, one for each single color sub-pixel 81. Note that the two green areas 81 are part of the same sub-pixel 81. Via these addressing lines that can be addressed individually, the pixel can be given a color of choice in the full color spectrum with the intensity as desired to represent one digital point of the image to be displayed. Such a prior art pixel, due to its size, may result in color breakup, especially when the pixel area is optically magnified which may occur in certain display applications such as e.g. autostereoscopic displays or projection displays.

To reduce or prevent the color breakup from occurring, the invention can be implemented in the pixel of FIG. 8A. One way to do this is according to the example shown in FIG. 8B. In this example the pixel 84 is square and has dimensions 83 that for sake of comparison with FIG. 8A, in this case are the same as those of the pixel 80 of FIG. 8A. Thus, the display panel of FIG. 8B would be capable of providing the same digital resolution as the display of FIG. 8A. However, the pixel 84 now has multiple light emitting areas according to the invention distributed over the entire area of the pixel 84. Two Green (G), one Red (R) and one Blue (B) light emitting area have been indicated in the upper left corner of FIG. 8B. Each light emitting area has dimensions 85 and the differently colored light emitting areas may be separated by the slim black linings in between them, but this is not necessary.

The dimensions 85 and the separations are specified according to the invention for creating the light emitting area output mixing. Thus, the green and red light emitting area on the upper left side of the pixel 84 may correspond to the first and second light emitting areas of some of the examples described with reference to FIGS. 1 to 3.

Figure 8B:
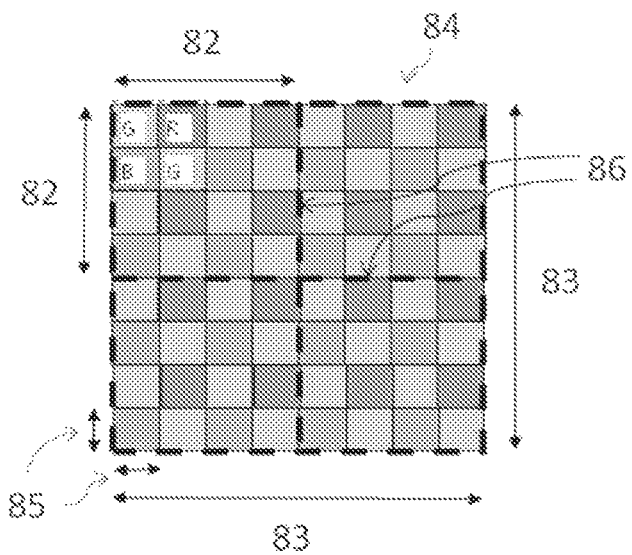

In this particular example of FIG. 8B the dimension 85 and the spacing are both 200 nm., i.e. smaller than the wavelength of green light with 500 nm. Alternatively the dimension 85 may also be 750 nm while the spacing may be only 250 nm or they may both be 500 nm.

Note that the FIG. 8B is only schematic. Only a few of the light emitting areas have been drawn for clarity. In practice there may be many more due to relative widths 83 and 85.

In an embodiment of FIG. 2B combined with FIG. 8B, where e.g. dimensions 85 are 200 nm so that the smallest whole square RGBG pattern repeats each 400 nm in both spatial directions (along which the widths 83 is measure), the width of a light emitting area is smaller than the wavelength of blue light. Hence all color areas of a smallest repeating unit RGBG are blended due to the resolution limit described herein before.

Other choices can be made according to the examples on how to choose dimensions for light emitting areas described herein before with regard to FIGS. 1 to 5.

Like the pixel 80 of FIG. 8A, the pixel 84 of FIG. 8B has three sub-pixels, being a red, two green and one blue one. These sub-pixels are depicted in the respective FIGS. 8C, 8D and 8E and they differ from the prior art sub-pixels with regard to the light emitting areas. The area with dimensions 82 in FIG. 8B no longer corresponds to the area where the original sub-pixels in FIG. 8A were located. The sub-pixels light providing area with dimensions 82 in FIG. 8A, have become distributed over the entire pixel area with dimensions 83 in FIG. 8B. Thus, in FIG. 8C there are 16 red (R) light emitting areas belonging to the red sub-pixel, but distributed over the entire area of the pixel 84. In FIG. 8D there are 32 green (G) light emitting areas belonging to the green sub-pixel and in FIG. 8E there are 16 blue (B) light emitting areas belonging to the blue sub-pixel. These light emitting areas all have dimensions 85 and those within each one of the sub-pixels are mutually separated by the dimension 85.

The dimensions 85 and spacing specified in the example of FIG. 8B as being 200 nm result in mixing of the light of all light emitting areas within a sub-pixel. The area of pixel 84 will, due to the mixing of the light emitting areas of the sub-pixels among themselves and among the other sub-pixels, be observed as a continuous, colored area. The different sub-pixel colors will thus not being separately discernible. Color breakup is therefore reduced or even absent.

Figure 8C:
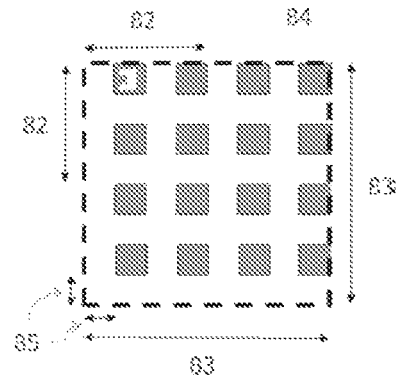
FIGS. 8C to 8E show the sub-pixels of the pixel of FIG. 8B according to the invention with distributed light emitting areas.
Figure 8D:
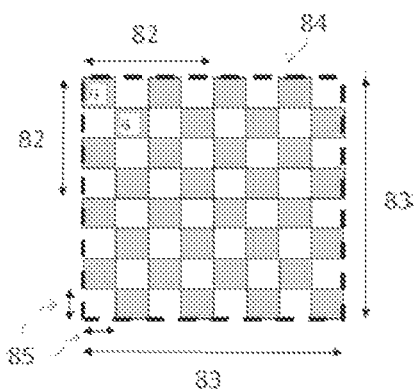
Figure 8E:
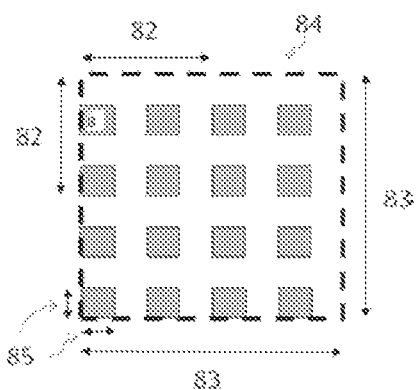

The areas of the sub-pixels of FIGS. 8C to 8E of each pixel of FIG. 8B add up to the corresponding sub-pixel areas 81 in FIG. 8A. Thus, the pixels of FIGS. 8A and 8B are capable of providing the same picture element information in terms of intensity of light output and digital resolution and also with an equal amount of addressing connections as all light emitting elements of one sub-pixel may be addressed with the same color and/or intensity setting for a certain pixel point by connecting them in parallel. The parallel addressing will be further elucidated herein below.

In an alternative embodiment of FIG. 8B, the amount of driving connections may be increased up to a level where less light emitting areas per connection of a sub-pixel are possible with the ultimate situation that every light emitting area has such an addressing connection that is individually addressable. In the ultimate situation every light emitting area is thus a sub-pixel and a pixel may be chosen to be much smaller (if the sub-pixel still has only four individual light emitting elements.) therewith increasing digital picture resolution in combination with having benefit of no color breakup according to the invention. This however requires extensive redesign of driving electronics as much more driving connections will be needed. The person skilled in the art will be able to achieve this as in semiconductor industry IC circuits have e.g. conductor dimensions that easily allow such increased density driving IC's. Also the additional resolution images may need to be available for having the benefit of this ultimate embodiment.

In an embodiment, the pixels of the panel may still be separated by a larger spacing than according to the invention. Then mixing within pixels occurs, but not between pixels. This may be advantageous for autostereoscopic displays as will be explained herein below. Preferably, the light emitting areas are all positioned and dimensioned according to the invention such that also mixing between neighboring pixels of the panel occurs. Smooth pixel transitions may therewith be achieved for 2D display devices. Regular arrays of light emitting area structures (see above) are preferred for this as they allow regular filling of the entire panel area with mixing pixels.

The invention can be applied to other pixel structures than the one of FIG. 8B. For example, PenTile and RGB stripes can be adjusted to incorporate the invention.

Figure 9A:
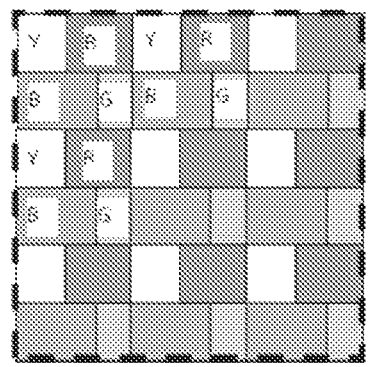
FIGS. 9A, 9B 10A and 10B show implementations of the invention to other pixel types.

The invention also applies to panels (and devices using these) that have more than 3 colors per pixel. An example is given in FIG. 9A where next to red (R) green (G) and blue (B) pixels there are also yellow (Y) pixels. The pattern further shows light emitting area differentiation among the sub-pixels. This can be used to create a good starting point to fill the color spectrum or to allow compensation for lifetime issues as sometimes necessary with e.g. OLED light emitters. Other multi-primary colors can be used.

Figure 9B:
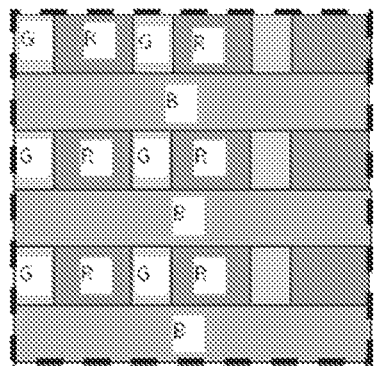

As said, one optional addition is that the areas are distributed to maximize the OLED lifetime of a pixel. This specifically means that green has least surface and blue most. FIG. 9B shows such a panel with the repeating arrangement in the pattern to comprises a green sub-pixel of a first area, a red sub-pixel of a second area larger than the first and a blue sub-pixel of a third area larger than the second area. The blue areas form a complete row, and this can simplify manufacture in the same way as the striped version of FIG. 10B.

Also, it is possible to exploit the differences in wavelengths of the colors by creating a sub-pixel structure where the distances between sub-pixels are to some extent proportional to the wavelengths. For example the repeating light emitting area pattern in a pixel can comprise an array with, three red, two blue and three green areas per pixel. The three red sub-pixel areas are in contact with each other to form a single cluster, such that the spacing between the red clusters is larger than the spacing between the blue areas or the green areas.

In the examples of FIG. 9 the dashed line gives the pixel area while sub-pixels comprise multiple light emitting areas of one color as in the manner described with reference to FIG. 8. Thus, the pixel in FIG. 9B has 9 groups of RGBY light emitting areas with each sub-pixel having the corresponding 9 areas of one color. Similarly in FIG. 9B the pixel has 9 groups of RGB areas, with each of the sub-pixels having 9 areas of a corresponding color RGB. The pixel may however be defined to be smaller, i.e. comprising less groups of colors with the ultimate situation of having only one group of colors.

Figure 10A:
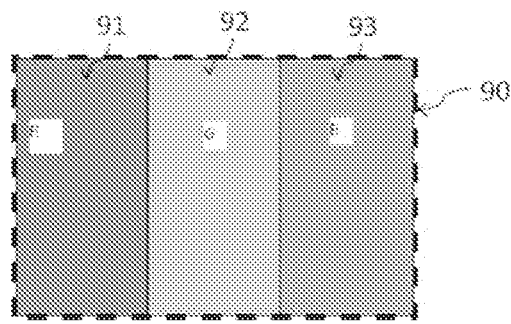
Figure 10B:
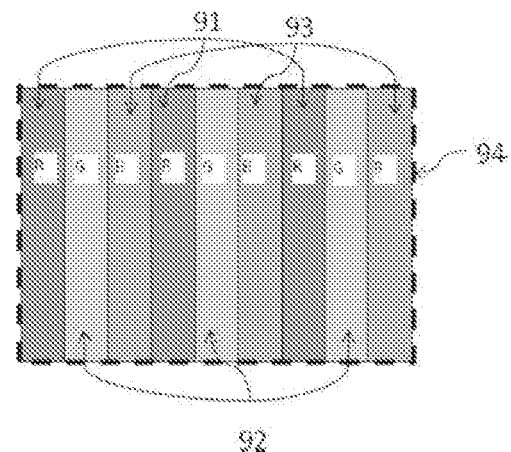

The production of a display panel pixel structure according to the invention may be simplified by using stripes as shown in FIG. 9B for the blue color or in FIG. 10B for all colors. Thus, the repeating pattern of each pixel comprises a set of distributed RGB stripes. FIG. 10A shows the corresponding prior art RGB pixel without the invention. The surface of each of the sub-pixels of FIG. 10B may be adjusted to maximize OLED lifetime. For example the width of sub-pixels may differ while the height remains the same. The size of the smallest sub-pixel (green) then determines the scale of the grid. This is not shown in FIG. 10B.

Figure 11A:
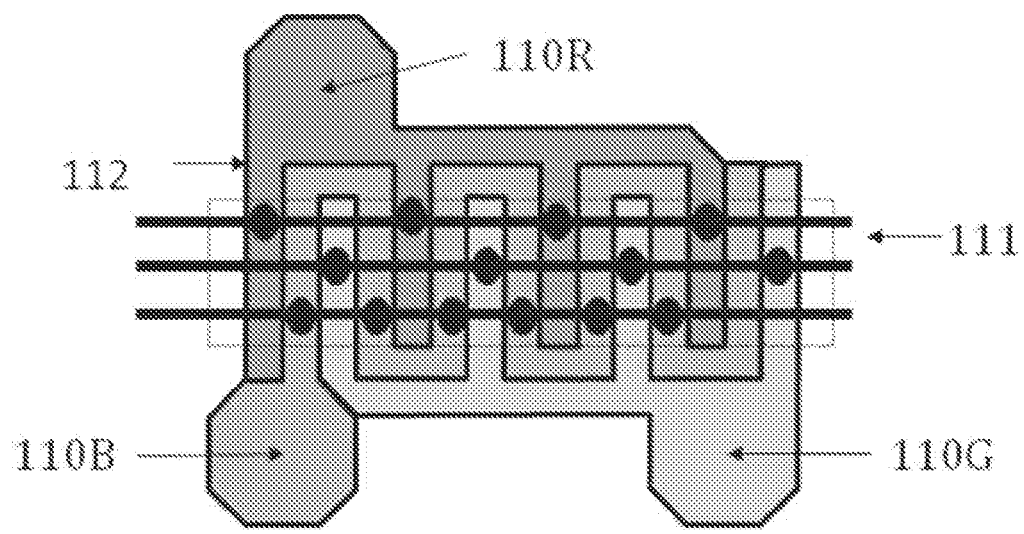
FIG. 11A shows a pixel with meandering and fork like sub-pixels having dimensions and mutual spacings according to the invention.

Pixels with interleaved continuous meandering or fork like sub-pixel structures can be made such as the one of FIG. 11A. In these each sub-pixel red, green or blue comprises only one corresponding light emitting area that has spacings and widths according to the invention. In FIG. 11A, the blue sub-pixel/area 110B provides light with the shortest wavelength, making it beneficial to choose the meandering structure of this blue sub-pixel. The red sub-pixel/area 110R or green sub-pixel area 110G have comb like structures. It is easy to extend the structure to four or even five different colors. The sub-pixel light emitting areas can be controlled by adjusting the width of the meander structure or the comb fingers. This may be important for maximizing OLED lifetime. The figure shows one pixel, and this pixel pattern is repeated across the panel area. The figure also shows the connections 111 to the sub-pixel electrodes from row lines used to address the different sub-pixels.

The sub-pixels in FIG. 11A are interleaved to allow good mixing of the colors. The structure allows implementation of the invention with one continuous light emitting area per sub-pixel with the (sub)-pixel area again not being bound to the areas defined by the small dimensions.

Whilst in some of the embodiments the invention requires a multiplicity of light emitting areas per pixel, this does not necessarily result in a more complicated addressing of the display. This is further illustrated with FIG. 12A and FIG. 12B for the case that the display is either an LCD base display (FIG. 12A) or an OLED based display (FIG. 12B). In both cases, the display is addressed in an active matrix manner, making use of just a single data line 120, a single select line 121 and a single select transistor 122 per sub-pixel. Alternatively passive matrix addressing may be applied which is well known in the art and will not be further described. In case of FIG. 12B, where current driving is necessary for driving the light emitting areas 125 in the form of diodes (e.g. OLED), there is also a power line 124 connected to the light emitting areas 125, with a drive transistor 124 in between the diodes and the power line to drive them when necessary. The other terminal of each light emitting area is connected to common ground. By connecting all light emitting areas 125 of one sub-pixel to the same data line through the addressing transistor 122 the number of addressing lines can be kept low in comparison to the situation where every light emitting element 125 is separately addressed with a separate transistor. Preferably, the light emitting area electrodes are realized in a single mask layer in the display fabrication process, as this makes definition, spacing and alignment of the areas more reliable. A storage capacitor may be provided between the power line and the gate electrode of the drive TFT.

The invention is of particular interest for displays having optical magnification means that magnify the panels of the invention. The beneficial effect is illustrated with respect to an autostereoscopic display example.

Figure 6:
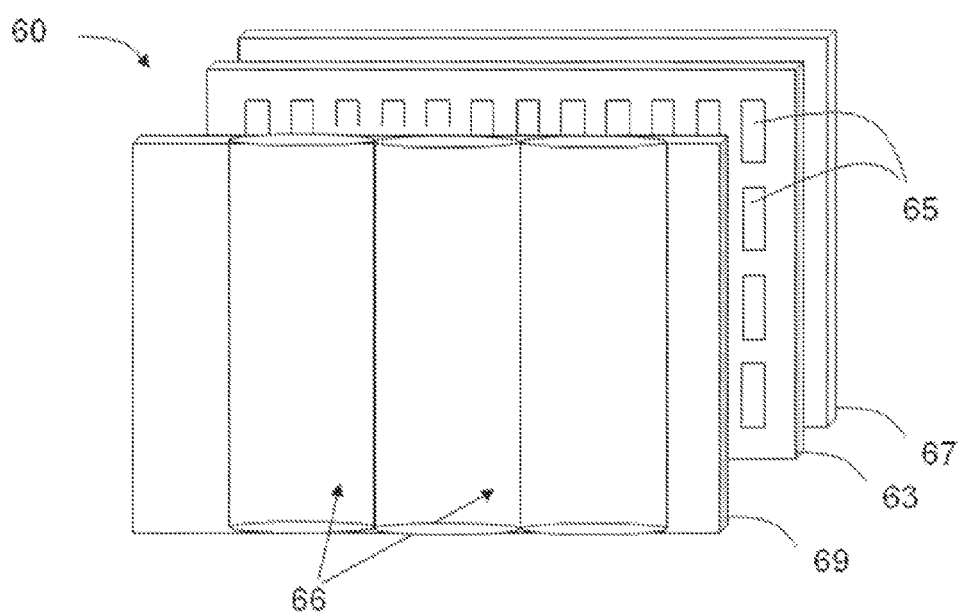
FIG. 6 is a schematic perspective view of a known autostereoscopic display device.
Figure 7A:
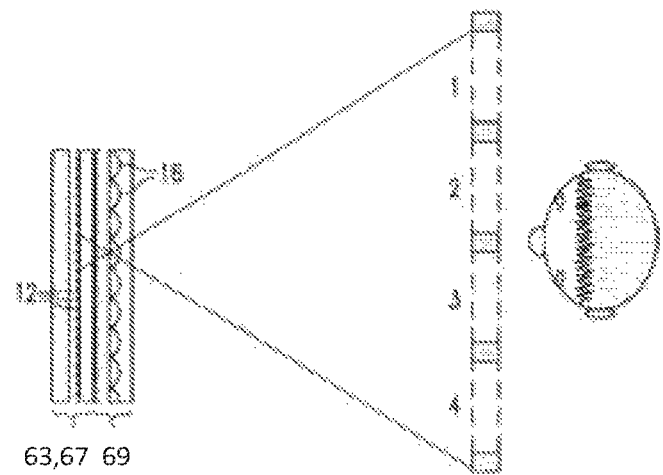
FIG. 7A is a schematic top view of the display of FIG. 6 showing the multiple views 1, 2, 3 and 4.
Figure 7B:
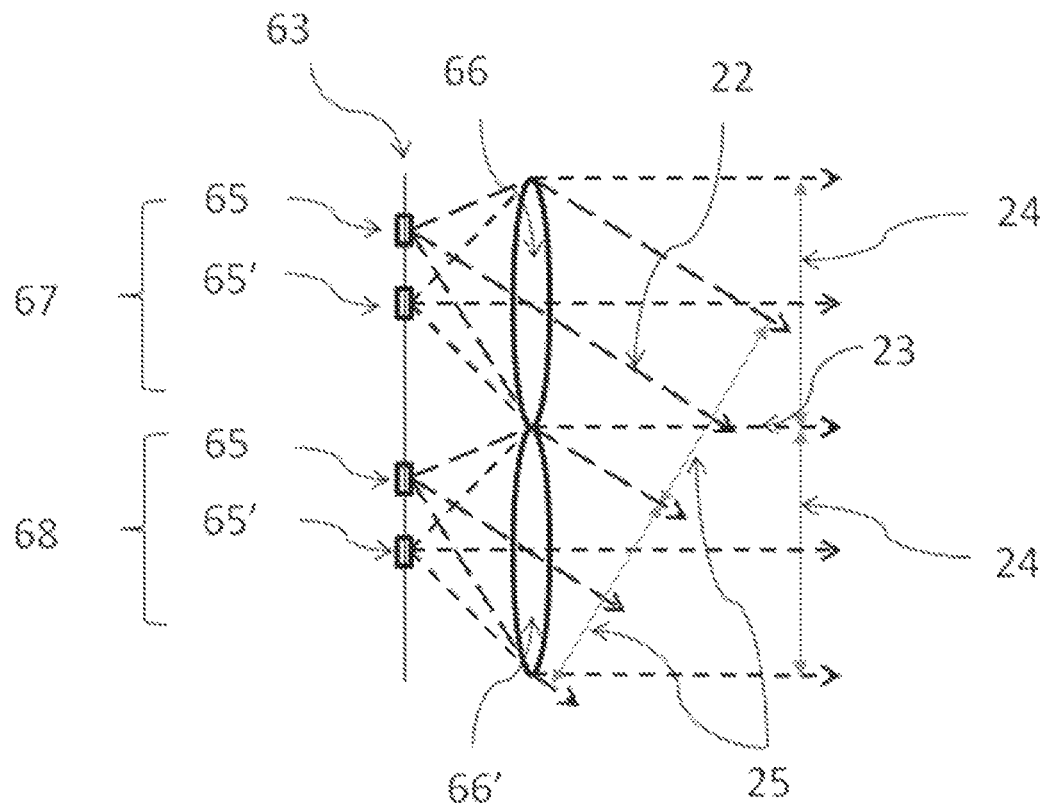
FIG. 7B is a schematic to view of the display of FIG. 6 detailing how view direction and pixel magnification occurs due to the view forming arrangement in the form of lenticular lenses.

FIGS. 6, 7A and 7B represent a direct view autostereoscopic display device 60 that comprises a liquid crystal display (LCD) panel 63 of the active matrix type that acts as a spatial light modulator to produce the display or image of a scene.

The display panel 63 has an orthogonal array of the color display pixels arranged in rows and columns. Each of the color pixels has a red, a green and a blue sub-pixel 65 in the row (horizontal) direction like in a regular color display. The panel thus also has columns of red, green and blue sub-pixels in an alternating fashion in the row direction. For the sake of clarity, only a small number of display sub-pixels 65 are shown. In practice, the display panel 63 might comprise about one thousand rows and several thousand columns of display sub-pixels 65.

The structure and construction of the liquid crystal display panel 63 is entirely conventional and will only be described briefly as the person skilled in the art will know how to fabricate and design such display panel. In particular, the panel 63 comprises a pair of spaced transparent glass substrates, between which an aligned twisted nematic or other liquid crystal material is provided. The substrates carry patterns of transparent indium tin oxide (ITO) electrodes on their facing surfaces. Polarizing layers are also provided on the outer surfaces of the substrates.

In one example, each display sub-pixel 65 comprises opposing electrodes on the substrates, with the intervening liquid crystal material there between. The shape and layout of the display sub-pixels 65 are determined by the shape and layout of the electrodes. The display sub-pixels 65 are regularly spaced from one another by gaps.

Each display sub-pixel 65 is associated with a switching element, such as a thin film transistor (TFT) or thin film diode (TFD). The display pixels are operated to produce the display by providing addressing signals to the switching elements, and suitable addressing schemes will be known to those skilled in the art. Thus each sub-pixel 65 is individually addressable for providing data to be displayed.

The display panel 63 is illuminated by a light source 67 usually indicated as a backlight. In a conventional arrangement, this comprises a planar backlight extending over the area of the display pixel array. Light from the light source 67 is directed through the display panel 63, with the individual display sub-pixels 65 being driven to modulate the light and produce the display.

The display device 60 also comprises an optical view forming arrangement in the form of a lenticular lens sheet 69, arranged over the display side of the display panel 63, which performs a view forming function. The lenticular lens sheet 69 comprises a row of semi cylindrical lenticular lenses 66 extending parallel to one another, of which only three are shown for the sake of clarity. The cylinder axis of a lens is parallel to the column direction of the display panel and in this case is drawn vertical in the plane of the drawing of FIG. 6.

The lenticular lenses 66 are in this case in the form of convex cylindrical lenses, and they act as a light output directing means for the light provided by the sub-pixels 65. Other lens shapes such as one with parabolic lens surface may be used. This is done in such a way that the optical view forming arrangement provides different images, also referred to as views, of the same scene displayed on the display panel 63 in different directions in front of the display enabling the left and right eyes of a user positioned in front of the display device 60 to receive different views. The autostereoscopic display device shown is thus capable of providing several different views in different directions for example the ones numbered 1, 2, 3 and 4 in FIG. 7A, of which a part is shown in FIG. 7B in more detailed and in a simplified way. The views can be provided with perspective images of the same scene to let the user perceive a stereoscopic image.

In particular, each lenticular lens 66 overlies a small group of display sub-pixels 65 in the row direction, i.e. in this case in a direction in which the lens surface is curved. In FIG. 7B, which is a top view of the display, for example two such groups 67 and 68 each including sub-pixels 65 and 65' are overlain by respective lenses 66 and lens 66'. The lenticular lenses (e.g. 66 or 66' in FIG. 7B) direct the output of each display sub-pixel of a group 67 or 68 in a different direction, so as to form the several different views. In particular, in FIG. 7B sub-pixels 65 of the different groups are directed into direction 22 providing a first view, while sub-pixels 65' of the different groups are directed towards direction 23 providing another view. In FIG. 7B it is only shown how two such views are formed with the lenticular lenses, but it will be clear how, by increasing the number of sub-pixels per group more such views can be constructed resulting in the situation of FIG. 7A or one with more than 4 views. Often 9 or 15 views are used providing a real look-around capability with multiple perspective stereoscopic views of a scene as also explained in the background section of this application.

In an autostereoscopic display each of the views projected in directions 22 and 23 in FIG. 7B provides a parallactic image of the same scene displayed on the display panel 63 as explained herein before. The viewer receives one view per eye and thus is able to observe a stereoscopic image from his specific position with respect to the scene.

In another display such as a so called dual view display the views are used to display entirely different content in such a way that a first viewer is able to see the first view while a second viewer is able to see the second view while they cannot see the others view. In that case a so called dual view display is generated that can be used in e.g. a car console or airplane dashboard. This requires adjustment of a.o. lens pitch with respect to the sub-pixel pitch. For a more detailed description of the construction and operation of a such a display, the reader is referred to the publications DE19920789A1 or U.S. Pat. No. 6,231,201B1, which are in corporate by reference in its entirety.

Returning to the autostereoscopic case of FIG. 6, as the user's head moves from left to right across the display and therewith across the views, his/her eyes will receive different ones of the several views in turn (e.g. in FIG. 7A, moving from right to left across the display, the viewer receives in his right and left eyes the respective sets of views: 1 and 2, 2 and 3 and 3 and 4), giving him/her the a stereoscopic look around effect if these views are displaying the appropriate parallactic images of the scene. Appropriate view assignment (assignment of view image information to the correct sub-pixels on the panel) is further elucidated herein below, a.o. with regard to FIG. 14 or 15 for a slanted lens display. An even more detailed description on how to construct and operate such a display with regard to view assignment and possibly image rendering is provided in U.S. Pat. No. 6,064,424, European patent EP1566683B1, or WO1997/023097 and references cited therein, which all are incorporated by reference in their entirety.

The total number of sub-pixels (all groups of 65 and 65') available on the display panel 63 for display of a 2D image, will have to be shared among the number of autostereoscopic views of an image of the same scene, assuming that there is no time sequential display of views. For example, for a 9 view display having regular square color pixels each including rectangular a Red, a Green and a Blue sub-pixel, as described with regard to FIG. 6 and for which the panel layout is further detailed in FIG. 15, and having a lenticular lens sheet with lenses with a lens pitch in the curved direction of 4.5 times the sub-pixel pitch in the horizontal direction, the pixels of the display panel will have to be divided over 9 views, where every view is an entire parallactic image of a scene displayed. In the display of FIG. 9 the lenses are slightly slanted with respect to the column direction. The view assignment is indicated in the sub-pixels. Thus, all sub-pixels with a number 1 in their view assignment are provided to view 1 and those with the number 5 are provided to view 5 etc. Note however, that although there are fewer pixels (sub-pixels) available per view, there are no black spots in a view, that is, the entire view area is filled with pixel information. This is due to the fact that the size of the sub-pixels has been increased by the view directing arrangement (see U.S. Pat. No. 6,064,424 for more detail on the 9 view system). Thus, for a lenticular display as represented by FIG. 7B, one must bear in mind that by looking at a sub-pixel through a lens of the lenticular lens sheet, while the sheet is located at focal distance of the sub-pixel, one observes this sub-pixel as lens filling in the curvature direction of the lens. Instead of its native size defined by the sub-pixel pitch one observes the sub-pixel in a view with a lens pitch; sub-pixel 65' becomes magnified to a size 24 for the view projected in direction 23 and the sub-pixel 65 becomes magnified to the size 25 in the view projected in direction 22. This enlargement of course will hold not only for lenses curved in only one dimension, but also for lenses curved in two dimensions. Consequently, the perceived image resolution within a view is smaller (theoretically 9 times in aerial terms) than the original one defined by the physical sub-pixel grid of the display panel. For the 9 view display the size of a unit picture element in a (3D) view in horizontal direction is approximately 4.5 times the original panel sub-pixel pitch.

In the display shown, for example in FIG. 7B, the top sub-pixel 65 may be a Red sub pixel while the lower sub-pixel 65 (projected by the next neighboring lens in the same direction) is then a green one. The next lower one (not drawn) is then a blue one. In this way the views (in this case in direction 22) are filled with red green and blue sub-pixels of increased size. This is described in more detail with reference to FIGS. 13 and 15.

While in 2D use, the size of the sub-pixels of the display panel 63 may be small enough to prevent color breakup to be seen by a viewer, in the autostereoscopic display based on the same 2D panel and having view directing means, it will now be clear that color breakup may and is even likely to occur due to the increased size of the color sub-pixels in a view due to the magnification. Indeed, the phenomenon of color breakup can be clearly visible in many known autostereoscopic display designs.

The effect will typically become relatively worse for displays with a higher number of views such as for example 15 views etc as then the group of pixels necessary to be overlain by one lens will be larger, thus increasing the magnification factor. It is noted that a higher number of views is generally desired as it provides improved stereoscopic or look around properties of a display.

The problem may be reduced or even prevented by replacing the display panel 63 of the display of FIGS. 6 to 7 with one according to the invention, for example any one of the example panels described herein before.

Figure 13:
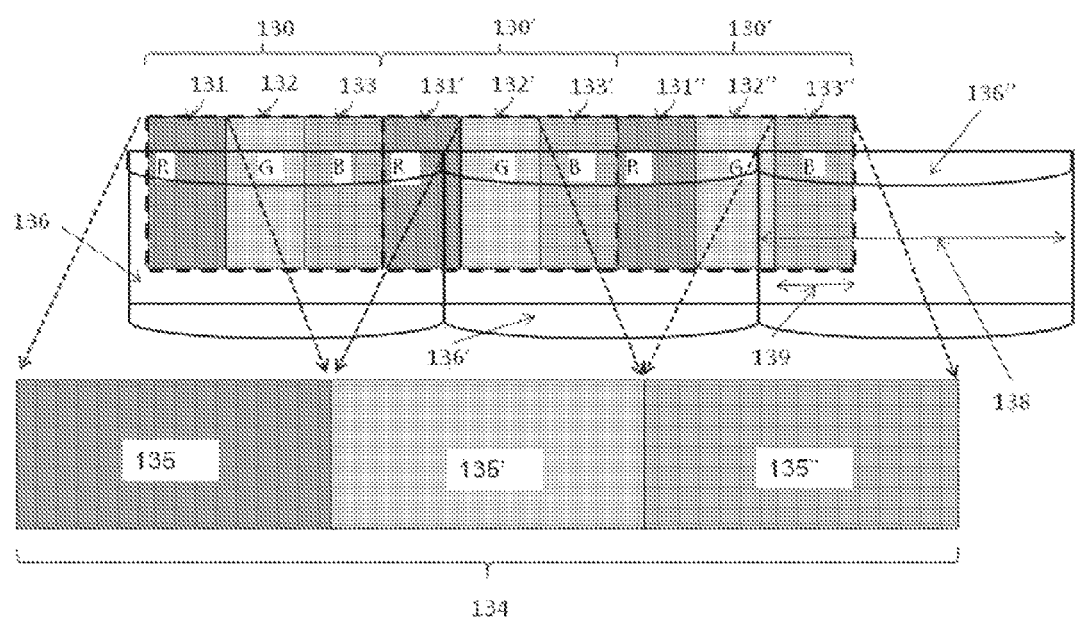
FIG. 13 shows how a unit view picture element in an autostereoscopic display as that of FIG. 6 comes about from the panel sub-pixels and the lenses.

With reference to FIG. 13, a prior art display, having the structure of FIG. 6 and operating in the manner of FIG. 7, has a display panel with conventional regular RGB pixel structure, i.e. like that in FIG. 10A. RGB pixels repeat in the row direction (horizontal in the drawing). If this panel of FIG. 13 was used as a regular 2D display panel, then there would be e.g. square pixels 130, 130' and 130", each of which had corresponding rectangular sub-pixels (e.g. 131 (R), 132 (G) and 133 (B) of pixel 130). However, in an autostereoscopic display the pixels and sub-pixels are defined differently due to the presence and principle of operation of the view forming arrangement. This has implications for implementation of the invention. Note that in order to prevent confusion, pixels and sub-pixels are defined on the panel as indicated herein before while the views have unit picture elements.

The autostereoscopic display of FIG. 13 has a lenticular lens array with a plurality of lenticular lenses as the view forming arrangement in front of the display panel. Only lenticular lenses 136, 136' and 136" have been drawn. Each lenticular lens has a cylinder axis along which there is substantially no lens curvature. The axis is parallel to the 2D pixel column direction which is vertical in the plane of the drawing. The lenticular lens has a pitch (width) 138 in the row direction such that one lenticular lens overlies 4 sub-pixels in the pixel row direction, i.e. the lens pitch is 4 times the sub-pixel width 139 in this pixel row direction. Furthermore, the display panel is substantially at focal distance of the lenses. This can be e.g. done using a glass plate in between the panel and lenses (not drawn). The sub-pixels are projected by the lenses into the views to form an image in the view with unit picture elements. The unit picture element 134 of a first view is shown in FIG. 13. This is in fact the 'pixel' actually observed by a viewer in a particular view of the 3D image. The dashed arrows indicate the origin sub-pixels of the parts 135, 135' and 135" of the unit picture element 134 on the display panel. The arrows do not indicate correct optical projection by the lenses. Note that the drawing is a perspective drawing where lenses are drawn slightly offset to the left in the row direction for clarity. The unit picture element 134 would be provided to view 1 of FIG. 6.

There are other views that come about in a similar way, but these are not shown in FIG. 13. The unit picture element 134 has unit sub-picture elements 135, 135' and 135". In the way explained with reference to FIGS. 6 and 7, each of these unit sub-picture elements is the result of the panel sub-pixels projected and magnified by the lenses such that their width is substantially 4 times the sub-pixel width 139.

Thus, in the autostereoscopic display of FIG. 13, the sub-pixels that end up in the same unit picture element of a view due to their same relative position under the respective lenses that overly them together define a panel pixel. For example sub-pixels 131, 132' and 133" of the display panel, form the panel pixel that results in the unit picture element 134 through the respective lenses 136, 136' and 136"

As explained with regard to FIG. 7, and due to the pitch of the lenses, the neighboring view unit sub-picture elements (e.g. 135 and 135' or 135' and 135") stem from panel sub-pixels that are 3 panel sub-pixels separated from each other. Thus, the view forming arrangement requires that the pixel on the panel has 'distributed' sub-pixels (e.g. 131, 132' and 133") in order to provide a correct view unit picture element 134 with neighboring (not distributed) view sub-picture elements 135, 135' and 135". In regular 2D use of the panel (without the lenses), a panel pixel (e.g. 130) would have had neighboring (non-distributed) sub-pixels (e.g. 131, 132, 133).

The display device of FIG. 13 thus is 4 view device as there are 4 sub-pixels under different parts of a lens in the direction of the lens surface curvature, which sub-pixels are therefore directed into 4 mutually different directions. As an example, a view unit picture element of a second view that is different from the one shown is formed with a pixel having sub-pixels 132, 133' and 131'"(the last mentioned sub-pixel 131'" is not shown in FIG. 13, but is neighboring the pixel 133" on its right side). The way views are directed is already explained with regard to FIG. 7.

To reduce or prevent the color breakup in the magnified view, the invention must be applied in such a way that color breakup in the unit picture element 134 is reduced. This requires correct implementation of the invention taking into account the directional function of the view forming arrangement (lenses).

One way to implement the invention is described with reference to FIG. 14.

Figure 14:
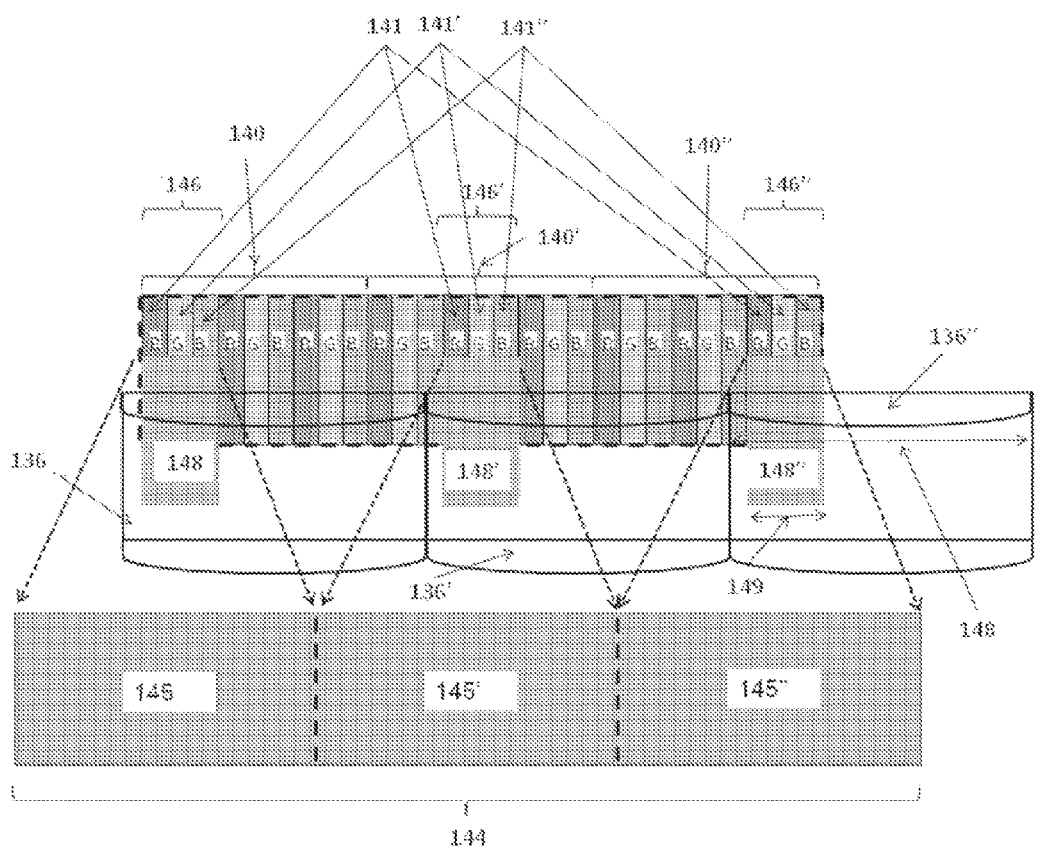
FIG. 14 shows how the invention can be applied to the display of FIG. 13.

In the autostereoscopic display of FIG. 14 the view forming lenticular lenses function in the same way as in the display of FIG. 13. They have the same dimensions, orientation and distance from the display panel as in FIG. 13. However, the panel structure, pixel and sub-pixel definition is different. Thus, the display panel in FIG. 14 has along the row direction (horizontal in the plane of drawing) red (R), green (G) and blue (B) light emitting areas of the invention in an alternating fashion. The RGB indicated areas in the drawing now represent light emitting areas according to the invention instead of sub-pixels.

In the example the spacings and widths of the light emitting areas in the row direction are according to the invention. Dimensions are such that the light output of a group 146 of succeeding RGB light emitting areas substantially mixes (for example since the widths of three succeeding areas together is about 0.6 micrometer). The mixed colored output will be observed as a substantially uniform output with an area 148. Two more of such areas 148' and 148" stemming from the respective groups 146' and 146" of light emitting areas have also been indicated in FIG. 14. The areas 148, 148' and 148" may represent light output mix areas For sake of comparison with the display of FIG. 13, the area of the groups 146, 146' and 146" as well as their corresponding light output mix areas 148, 148' and 148", correspond with the respective sub-pixel areas 131, 132' and 133" of FIG. 13. In practice the width 149 of a mix area (e.g. 148) will be much larger (in this case equal to the sub-pixel width 139 of the prior art autostereoscopic display of FIG. 13.) than the width of a single light emitting area (in this case 0.2 micrometer), so that in practice there will be many more of these light emitting areas than three in a mix area. However, for sake of clarity, only three light emitting areas per light mix area have been drawn. Since the optical lenticular lens arrangement of FIG. 14 with lenses 136, 136' and 136" is the same as that of FIG. 13, the areas 148, 148' and 148" are projected towards a viewer into the areas 145, 145' and 145" of the view unit picture element 144 and these areas 145, 145' and 145" thus correspond to the respective view unit sub-picture elements 135, 135' 135" of the view unit picture element 134 of FIG. 13.

The panel of FIG. 14 therewith has distributed sub-pixels in that the light emitting areas of a sub-pixel contributing to the view unit picture element 144 are not all nearest neighboring areas that abut each other such as to form one single light emitting area. More specifically, in the panel there are now sub-pixels 141 (Red), 141' (Green) and 141" (Blue) and each of these has its light emitting elements distributed over the groups: 146 (for providing mix area 148), 146' (for providing area 148'); and 146" (for providing mix area 148").

In the autostereoscopic mode, the panel thus comprises pixels such that every pixel covers multiple continuous areas (in this case 148, 148' and 148") each comprising light emitting areas of all sub-pixels (in this case 141, 141' and 141") where these multiple continuous areas are not contiguous.

The distribution of light emitting areas of a sub-pixel in this way allows reduction of their sizes and spacings to dimensions according to the invention for mixing of their output light without interfering with the view directing function of the lenticular lenses, so that view unit picture element buildup is unaltered.

In the display panel of FIG. 14, the sub-pixels 141, 141' and 141" are driven with the same image point data (after all they represent one image point in the view), which, in practice, amounts to an intensity value as the color is fixed by the nature of the elements (OLED or else) the light emitting areas belong to. Therefore, together the sub-pixels 141, 141' and 141" form a pixel that after magnification is the view unit picture element 144 of which the regions 145 to 145" are indistinguishable as they have been built up with the same data, i.e. e.g. same intensity value of the light emitting areas in each one of the sub-pixels.

Thus, color breakup may be reduced or even prevented while retaining picture resolution in a view as the view unit picture elements 134 and 144 are still equally large. This can even be done without additional driving electronics in the sense that still the same amount of select and drive lines are needed with or without the invention. The light emitting areas of each sub-pixel 141, 141' or 141" can simply be connected in parallel and driven simultaneously using a driving means of a conventional autostereoscopic display as described herein above with respect to FIG. 12.

It will be clear that in a similar way as described for the RGB pixels, other pixel patterns of panels of autostereoscopic displays may be implemented with the invention.

A consequence of the invention is that, since the entire panel pixel structure across the panel can be designed to provide continuous blending of colors by specifying the spacings of all light emitting areas according to the invention and/or the sizes of the light emitting areas, the size of an actual color pixel or sub-pixel that is individually addressable may be chosen to be any size by definition of the number of light emitting areas per (sub)-pixel. Blurring of boundaries and/or complete mixing of light of light emitting areas will occur always magnification or not. The limit in smallest size of the sub-pixel is the light emitting areas minimum size (e.g. 85 in FIG. 10). The definition of sub-pixel and color pixel is thus only dependent on design of addressing means including interconnection of light emitting areas and its operation, possibly in combination with the way the views are formed with the view forming arrangement. A flexible driving means capable of adjustment of driving in the above sense is thus advantageous. This will be further described herein below.

Having free choice of (sub)-pixel size without having to take in to account possible color breakup is advantageous for the design of autostereoscopic displays. This is due to the fact that the ratio between pitches of sub-pixels and view directing means, such as the lenticular lenses (see for example here above and U.S. Pat. No. 6,064,424), are partly determining the number of views to be displayed by an autostereoscopic display and therewith e.g. also the look around capability. In case of lenticular lens based autostereoscopic displays, the lenses or lens arrays may be difficult or expensive to manufacture and difficult to align on the display panel pixel structure, especially when lenticular lenses become smaller (smaller pitch). Hence, for this reason it may be advantageous to provide lenses with a certain sufficiently large size/pitch, which are easy to manufacture or align on the display panel, but which, when the current invention would not be used, results in the color breakup. The invention now provides for decoupling of this lens design from the effect of color breakup. Small feature sizes of (sub)-pixels is easier to realize than solving the fabrication and alignment difficulties for the lenticular lenses.

In the examples above the autostereoscopic display has semi-cylindrical lenses with a lens surface that has no curvature along its cylinder axis. As the axis is oriented along the column direction (vertical in the drawings) in FIG. 6, 7, 13 or 14, the lenticular magnification thus does not occur parallel to the vertical, i.e. parallel to the cylinder axis as there is no lens operation along this axis. In general the magnification occurs only along directions in which the lens surface is curved. Now in the examples of FIGS. 13 and 14 sub-pixels, distributed or not, displaced only in the horizontal direction provide a contribution to a particular view unit picture element. Thus, for the display of FIG. 14, the view unit picture element contributions all stem from continuous pixel areas 148, 148' or 148" and thus from sub-pixels 141, 141' and 141" of one and the same row on the panel (from the same horizontal axis). This also results in the elongated shape of the view unit picture element 134 and 144 in the horizontal direction.

This view unit picture element shape can be adjusted to be more 'square like' instead of horizontally elongated using a device wherein sub-pixels of different rows in the panel are used to form a view unit picture element. This can be done using a display device where the cylinder lens axis is slanted with regard to the pixel array, i.e. where there is a non-zero angel between these. In one example one can use a panel with non vertical columns as in e.g. FIG. 4, in combination with vertical cylindrical lenses. In another example a regular panel having the vertical pixel columns in combination with the lenticular lenses that have their cylinder axis slanted can be used. Examples of the latter are described in good detail in for example U.S. Pat. No. 6,064,424.

Implementation of the invention in an example autostereoscopic display with slanted lenses is described with reference to FIGS. 15A, 15B, 16A and 16B.

Figure 15A:
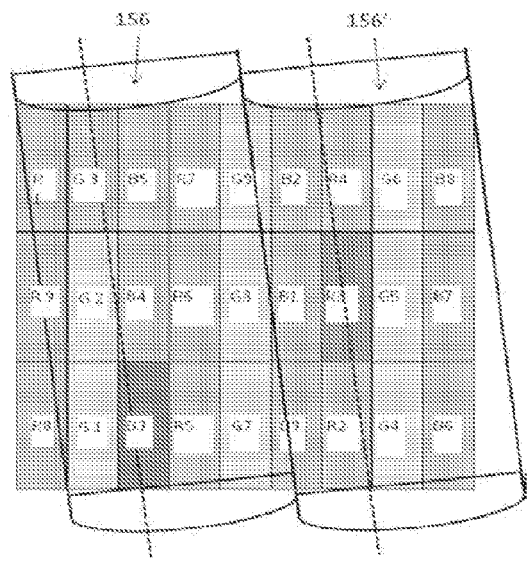
FIG. 15A shows a part of a known autostereoscopic display with slanted lenticular lenses.

FIG. 15A shows a prior art 9 view autostereoscopic display device that operates as described with regard to FIGS. 6 and 7. A more detailed description of how to construct such a display is found in U.S. Pat. No. 6,064,424 and will not be repeated here. The display has a regular pixellated display panel with lenticular lenses 156 and 156' overlying the panel. The arctang of the slant angle of the lenses cylinder axis with respect to the pixel column direction is ⅙ and the lens pitch in the row direction is 4.5 times the width of a sub-pixel. This determines the view assignment scheme, i.e. the assignment of panel sub-pixels to the distinct 9 views possible.

The colors of the sub-pixels are indicated with letter R (red), G (green) and B (blue). In addition the view number the output of a particular sub-pixel is projected in by the lenticular lens (156 or 156' shown) overlying it, are indicated with a number in the range of 1 to 9. Thus e.g., due to the relative positions of sub-pixels G3, and B3 with respect to lens 156 (both are under the dashed line indicating the same light projection direction) and R3 under lens 156' (under similar dashed line as that for lens 156), these are all projected in the same direction, being view 3.

As described herein before, the sizes of these sub-pixels upon projection by the lenses become magnified as they are located substantially at focal distance of the lens (the sub-pixels become lens filling when viewed at through the lens). The result is that a view unit picture element in view 3 is substantially observed like it is drawn in FIG. 15B. Here view unit sub-picture elements 155, 155' and 155" stem from the respective panel sub-pixels G3, B3 and R3. Thus for the autostereoscopic mode, panel sub-pixels R3, G3 and B3 together define a pixel.

For the sake of clarity cross talk between views has not be taken into account in this drawing. Thus, crosstalk providing panel sub-pixels from other views than view 3 (such as e.g. G2 or B4 that would be projected in between areas 155 and 155') have not been drawn in the FIG. 15B.

Figure 15B:
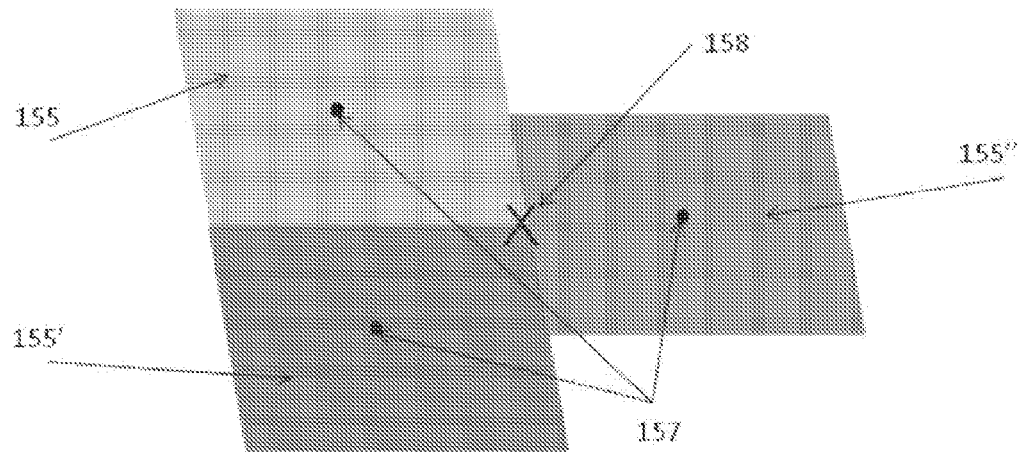
FIG. 15B shows how the unit view picture element is built up from the sub-pixels of the display panel of FIG. 15A.

As the sub-pixels of a pixel are within different rows they do not form a horizontal elongated view unit picture element after projection by the lenses, but a more triangularly shaped one as in FIG. 15B. This is preferred over the elongated view unit picture element shape in view of perceived resolution differences in vertical and horizontal direction. Nevertheless, color breakup can occur as there is magnification.

Figure 16A:
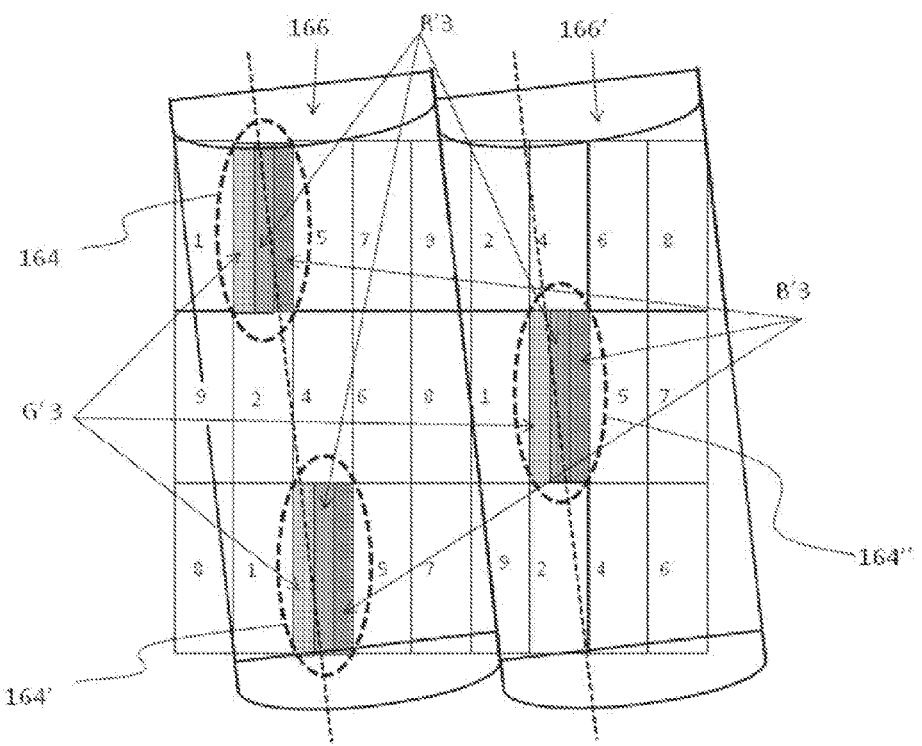
FIG. 16A shows how the invention can be applied to the display of FIG. 15A.

This color breakup can be reduced or prevented by implementing the invention. One example to do this is drawn in FIG. 16A. In this example the lenses 166 and 166' and their orientation with respect to the panel is identical to the lenses 155 and 155' and their orientation to the panel in FIG. 15A. Hence, view assignment of continuous areas (e.g. 1, 2, 3 etc) of the panel of FIG. 16A that correspond with regard to position and area to sub-pixels in FIG. 15A (e.g. 1 in FIG. 16A is the same as R1 of FIG. 15A) is the same. The color indications present in view assignment of FIG. 15A have been left out of the view assignments in FIG. 16A.

In FIG. 16A, the panels continuous area's with view assignment 3, corresponding to sub-pixel areas G3 of FIG. 15A, each have a group 164, 164' or 164" of light emitting areas according to the invention. Thus in such a group or continuous area there are differently colored, vertically elongated, light emitting areas of sub-pixels G'3, B'3 and C'3 as specified according to the invention. The light emitting areas have the same dimension as in FIG. 14 such that light emitting areas of one group (e.g. those of 164, 164' or 164") substantially mix. In a manner similar to that described for FIG. 14, the mixed output of the light emitting areas of each group of FIG. 16A is then directed by the respective lens overlying the group into the view pixel of FIG. 16B. In this way, the areas 165, 165' and 165" that together form the view unit picture element, stem from the groups of light emitting areas 164, 164' and 164" on the panel, respectively. Again, as with the display of FIG. 14, the display panel of FIG. 16 has distributed sub-pixels (e.g. R'3, G'3, and B'3) within a pixel. More particularly, the groups 164, 164' and 164" (their continuous areas) that are mutually non-contiguous form the pixel and each of these groups has at least one red R3, at least one green G3 and at least one blue B3 light emitting area. All light emitting areas of these groups together thus belong to one sub-pixel of the pixel. Accordingly, the sub-pixel is distributed, not only along a row, but also among rows.

Thus, when e.g. the spacings and widths of the light emitting areas are in the range of 200 nm in FIG. 16A, complete mixing of their output is achieved and a view unit sub-picture element area 165, 165' or 165", each of which corresponds to a single color view unit sub-picture element area 155, 155' or 155" of FIG. 15A, now has one mixed color. Since the sub-pixels (e.g. G'3, B'3 and R'3) provide the color to each of the view unit picture element areas simultaneously via parallel addressing, the mix color of the entire view unit picture element (total area of 165, 165' and 165") is the same. Thus reduced, or no color breakup occurs in a view while retaining picture resolution with regard to the prior art display without the invention.

For the sake of clarity in the above arrangements there are drawn only 3 light emitting areas per group. In practice however there may be and probably will be more. Thus, e.g. if a panel area such as 3 would have a width of say 30 micrometers (a width of a sub-pixel in a prior art display) and the width of only one light emitting area according to the invention would have to be 0.2 micrometer, then there would be 50 light emitting areas of the same color in the area 3 alone, adding up to 150 of such areas for all three colors.

Figure 12A:
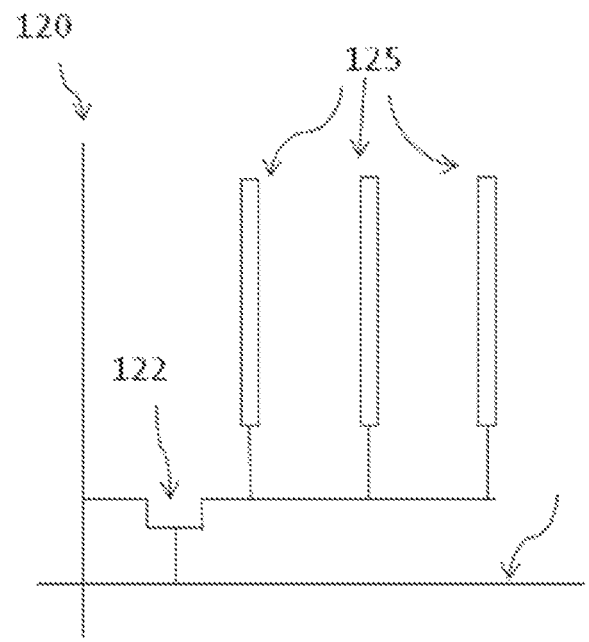
FIGS. 12A and 12B show how multiple light emitting areas within one sub-pixel or pixel can be addressed with one address line by parallel interconnect.
Figure 12B:
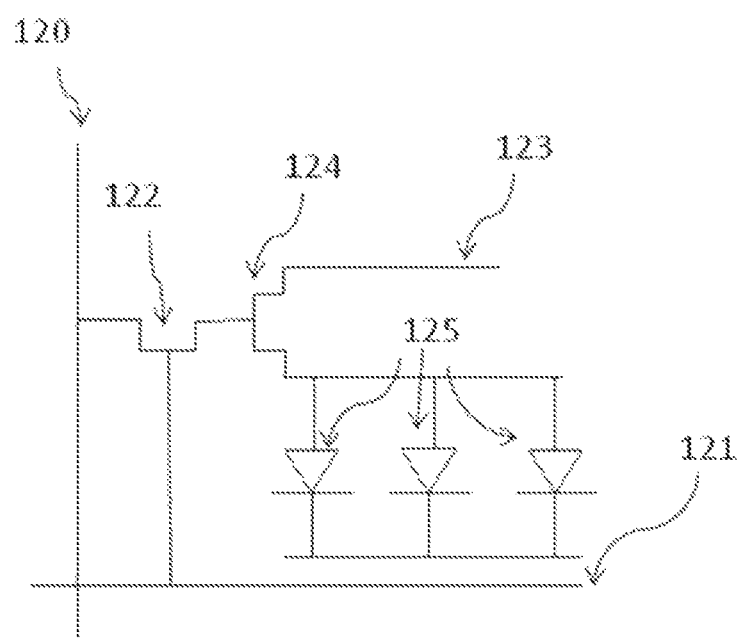

In the above embodiments of autostereoscopic displays, it has been explained with regard to for example FIGS. 12A and 12B that the light emitting elements of the sub-pixels of the panels could be connected to one and the same drive line. Thus advantageously no additional driving connections are needed for incorporation of the invention in an autostereoscopic display. This means that digital resolution of a prior art display and that of the one having the invention can remain the same. For example, the view unit picture element of FIG. 15B represents a view image point X with roughly a position 158 in the panel. Due to the number of drive lines remaining the same in the display of FIG. 16A having the invention, also in the view of FIG. 16B the unit picture element represents the same image point X at position 168. The resolution of a view that can be shown remains thus the same with or without the invention.

Figure 16B:
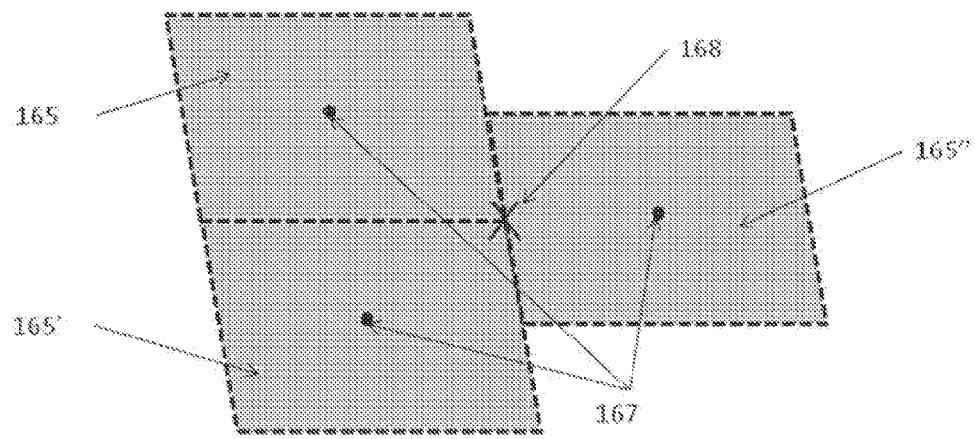
FIG. 16B shows the effect of the invention as applied according to FIG. 16A on the unit view picture element of FIG. 15B.

In a device according to the invention, resolution can however conveniently be increased due to application of the invention. Again with reference to FIGS. 15 and 16 as an example, it can be seen that in the view unit picture element of FIG. 15B the points 157 represent views unit sub-picture elements with different colors. In contrast, the corresponding positions 167 in the view unit picture element of FIG. 16B represent the same mix color, i.e. each of the areas 165 to 165" has full color capability. Thus, whereas in the view unit picture element of FIG. 15B these points 157 should have the same image position 158 information, the corresponding points 167 in the view of the invention display may represent mutually different image point information not equal to that of 168. Hence, in the display of FIG. 16A resolution can be increased with a factor of 3. This however requires that not all light emitting areas of a particular sub-pixel can be connected to the same address line and be addressed simultaneously. Instead a factor of 3 more address lines per sub-pixel is needed and the pixels with its sub-pixels need to be redefined, i.e. the same view assignment is used but pixels have become smaller.

An example of this redefinition of pixels and sub-pixels is explained with reference to FIG. 16A. Whereas the groups 164, 164' and 164" in the previous embodiment defined one and the same pixel, in the new embodiment these groups each define a pixel on their own. Each of these pixels now has three sub-pixels, i.e. in the drawing that would be a Red one of R'3, a Green one of G'3 and a Blue one of B'3. In the drawing each of these sub-pixels at least has one light emitting area of corresponding color. In the drawing only 3 light emitting areas per group were drawn. However, in practice there may be many more. Thus again each sub-pixel can have a plurality of light emitting areas of one color. The single light emitting element or the plurality of light emitting elements per sub-pixel is then individually addressable.

The advantage is thus increase of resolution per view again without color breakup.

Thus simply having a display panel with light emitting area connection pattern as in the latter display, i.e. having a factor of 3 more addressing lines, results in an autostereoscopic display that can display stereoscopic images with at least two resolutions without change of lens structure or orientation. Both resolutions would be in a multi-view display mode of 9 views.

In the example autostereoscopic displays of FIGS. 14 and 15, the light emitting area pattern per group (continuous area of a pixel) that is sent into one view by one lens (e.g. RGB in group 146) repeats for succeeding such groups along the row direction. Although having the same order of colors of light emitting areas within such a group may help in providing a more uniform mixing result of the light among the different groups, i.e. mixing areas, this need not be the case. Permutation of the order of the light emitting areas is allowed without loss of the effect of the invention, especially when all light emitting areas of a group mix entirely. Thus the order may differ among the groups, such that for example the group 146 may have RGB while group 146' may have GBR etc. In the present examples distribution has been effectuated by slicing up along the horizontal (column direction). Alternatively, or in addition, groups may have light emitting areas in the horizontal direction. As long as the dimensions fulfill the criteria for mixing, the output of the group will be mixed and result in the desired view pixel.

In fact, any distribution of light emitting areas may be used within a group or continuous pixel area as long mixing is effectuated using the invention.

In an embodiment the display panel has drive means that allow redefinition of pixels and sub-pixels with regard of light emitting elements that are part of the sub-pixels. Such panels are suitable for displays that have more than one display mode. Examples are autostereoscopic displays that have at least two different autostereoscopic display modes or those that have a regular 2D display mode in addition to one or more autostereoscopic display modes.

Both types of display require that drive means allow that sub-pixels may be defined differently within the different modes. In some cases this requires additional functionality for the drive means.

An embodiment having two different autostereoscopic modes is described. The embodiment may e.g. closely resemble the one of FIG. 14. The first autostereoscopic display mode is the 4 view mode as described herein before with regard to FIG. 14. The second view mode is then a 2 view autostereoscopic mode.

In the 2 view mode, the sub-pixel definition is such that a group of light emitting areas; e.g. 146, 146' or 146" comprise twice as many light emitting elements. To this end, the groups 146, 146' and 146" may be chosen to be twice as wide, i.e. the width 149 would be twice as large as indicated in FIG. 14.

This poses no further requirements on the drive means other than that light emitting areas of one and the same color but of neighboring groups can be addressed simultaneously, as these neighboring groups now are part of one and the same pixel of the 2 view mode. Thus, content of different nature having 2 instead of 4 views in combination with different resolution, requiring increased view unit picture element areas for 2 views are enabled all without color breakup.

The driving means in the form of addressing electronics can be implemented to allow for such a switch of view mode as the smallest addressable units have the necessary resolution for this, i.e. in the 2 view mode only two sub-pixels need to be driven with the same information. While the addressing lines and transistors for individually addressing each of these sub-pixels are already provided in the 4 view mode, this thus means that 2 addressing transistors will be operated simultaneously in the 2 view mode using a somewhat adjusted view assignment, i.e. assignment of intensity value to the correct panel sub-pixels in order to obtain the right 3D view unit picture element for the 2 view mode.

In the above embodiment with different view modes, the 2 view mode has different view cone characteristics than the 4 mode as different areas under a same curvature lens are combined into one view unit picture element. In some cases this may be problematic or undesired. In these cases the display may additionally have active lenses that allow adjustment of their e.g. lens curvature and or lens pitch. This may be done using e.g. Graded Index (GRIN) lenticular lenses as described in international patent publication WO2008/126049A1 or US2010/0026920 which is incorporated by reference in its entirety. In such lenses the signals applied to the electrodes of a lens for inducing the curvature of the lens, may be adjusted possibly in combination with the specific number or sub-set of electrodes that define a lens. Thus, the above adjustments of view mode can also be used in combination with adjustments to the lenticular lenses.

With regard to FIG. 16 it was explained how a modification of the display of FIG. 16 obtained by addition of addressing lines could be used to increase 3D-resolution or be used as a display that can have multiple autostereoscopic modes in the sense of number of views to be displayed. This required that the light emitting areas of one color per group or continuous pixel area (146, or 146' or 146") are individually addressable in order that any of the groups/continuous areas can function independently.

An additional advantage of a display panel having such addressing possibility is that the same panel is now capable of display of also high resolution 2D images without color breakup. This was difficult in case of the display of FIG. 16A as the sub-pixels had the distributed light emitting areas connected in parallel and not individually addressable. Hence pixel redefinition that is necessary for the 2D mode of display is then not possible.

Thus, with reference to e.g. FIG. 14, in the 2D mode of the reconfigurable display panel the pixel can comprise a group (continuous area) of light emitting areas such as the group 146, or such as the group 140, where the sub-pixels of the pixel 146 or 140 would have the appropriate colored light emitting areas connected in parallel to one drive line, i.e. in both cases the light emitting areas of a group as small as the group 146 should be connected in parallel and should be individually addressable from the ones of other such groups. This enables reassignment of different of such groups 146 to a pixel as necessary for having either the autostereoscopic mode or the 2D mode. Although in principle the addressing means now would also be suitable for defining one group of light emitting areas such as group 164 as a pixel, this pixel would not be of square shape. Therefore the 2D mode of the display panel preferably has pixels 140, 140' and 140" each having with 3 contiguous groups 146 in the row direction as that results in square pixels giving perceived resolution homogeneity in the horizontal and vertical direction across a display panel.

Hence, the panel with increased addressing capability is suitable for an autostereoscopic display that can be switched to a mode for displaying 2D images. In order to be able to really have a display that can switch between the 2D and 3D autostereoscopic mode, without having to sacrifice native panel resolution in the 2D mode, requires that the view forming function of the display can be switched off. Any view forming arrangement that is capable of being switched off can be used with the invention.

In the current example having the lenticular lenses as the view forming arrangement, such switching can be done by using lens systems that in the autostereoscopic mode function as lenses with the view directing effect, while in the 2D mode are transformed in transmissive arrangements that substantially lack the view forming function.

The incorporation of switchable lenses can be done in multiple ways. Practical examples for implementation of such switchable lenses are not described in detail here as such lenses can be combined with panels of the invention through reference to prior art technology. Thus, for example the detailed implementation, in a device with a panel according to the invention, of: a switchable lens array is described in European patent EP0877966B1, or for Graded Index Lens arrays (GRIN) in US2007/0296911, US210/0026920 or WO2008/126049A. However, other lens switching principles, such as e.g. the one using solid state double refracting lenses in combination with light polarization switch as described in US2006/0098285 or US2006/0098296, or the one based on electrowetting principles can also be used with the invention. All of these references are herewith incorporated by reference.

In particular, the autostereoscopic mode may be the one wherein the display of FIG. 16A has the slanted lenses and sub-pixel view assignment such that the view unit sub-picture element areas 165, 165' and 165" together define the view unit picture element 168. This mode is extensively described herein before.

In addition to lenticular lens arrays, the optical imaging means may comprise a barrier, or a microarray of (semi)-circular lenses, If a display incorporates lenses that have curvature in all directions across the lens and the lens overlaps not only at least two columns of sub-pixels but also two or more rows of sub-pixels, the invention can be implemented as described with respect e.g. to FIG. 14.

As the single-layer manufacturing precision used for display panels is better than the wavelength of visible light, patterns can be produced without more expensive processing steps.

An example of a process providing the required resolution for the implementation of the invention is the photolithograph process that is used to create LCD and AMOLED display panels. In such a process, structures of 200-300 nm can be created. The wavelengths of red, green and blue emitters are 650, 510 and 410 nm, respectively.

The invention is of particular interest for light emitting displays such as the LEDs or OLEDS as opposed to light transmissive displays such as LCD's. The most common existing LCD technologies rely on backlit displays. With an average gray level of 18% in video, 82% of the polarized light is absorbed in an LCD system. All the layers in the screen combined have a transparency of about 7%. This means that effectively on average only 18%×7%=1.6% of the emitted light leaves the screen. A display with directly emitting pixels in comparison only emits the required light and thus even if the finishing layers remove half of the light, the display would have 50%/1.6%=31 times the efficiency of LCD for average content. For white the efficiency would be 50%/7%=7 times the efficiency of LCD.

There is therefore a strong incentive to use directly emitting pixels for displays, including autostereoscopic displays.

Organic light emitting diodes (OLED), polymer light emitting diodes (PLED) and transistors (OLET) are new principles to produce efficient and powerful flat emitters of almost any desired shape and size. One option is to use an LCD design with an LED backlight. However, to use the full potential of OLED/PLED, or OLET, the pixels themselves should be emitters to improve the efficiency. In addition, this avoids diffraction effects which will arise when wavelength scale features are illuminated by a backlight. Thus, the use of OLED, PLED or OLET pixels is preferred, and enables a practical manufacturing method as explained below.

In some embodiments, the invention requires a process that allows the creation of structures with feature sizes that approach or become smaller than that of visible light as described herein before. An example of such a process is the photolithograph process that is used to create LCD and AMOLED display panels.

In such a process, structures with design rules of 200-300 nm can be created. In the future the design rules will presumably be further reduced, whereby it will become possible to produce such sub-wavelength emission structures using traditional display manufacturing methods namely:

creating sub-wavelength size emitting electrodes adjacent to each other—preferably in a single mask step and on a planarized substrate layer, patterning an OLED layer on top of its associated electrodes, either by depositing on top of a patterned insulator (with an opening above the electrode) or by removing OLED from electrodes of the other colors e.g. a lift-off process, patterning subsequent OLED layers on top of their associated electrodes for example by depositing on top of a patterned insulator (with an opening above the electrode) or by removing OLED from electrodes of the other colors.

Such an exercise is however challenging using existing design rules. For this reason, a preferred manufacturing method makes used of solution processed OLED or Polymer LED (PLED) manufacturing.

Traditionally, this has been realized by depositing the organic molecules or polymers using an ink-jet printing type of process.

A key to such a process is to manufacture "dam" style structures and to use these dams to limit the spread of the solution to the dimensions of the emitting area.

The dams must have a sub-wavelength size and be aligned between the emitter electrodes.

In addition, it is helpful to provide at least a portion of the area within the dam with a larger dimension (typically in excess of 10 microns) in order to facilitate easy alignment of the inkjet printing head with the display substrate over the entire area of the substrate (typically 2m×2m).

In order to realize sub-wavelength sized dams positioned between the emitter electrodes, it is preferred to use the emitter electrodes as a mask for exposure of the photo-resist layer which is used for the dam (e.g. SU-8 or similar).

Figure 17:
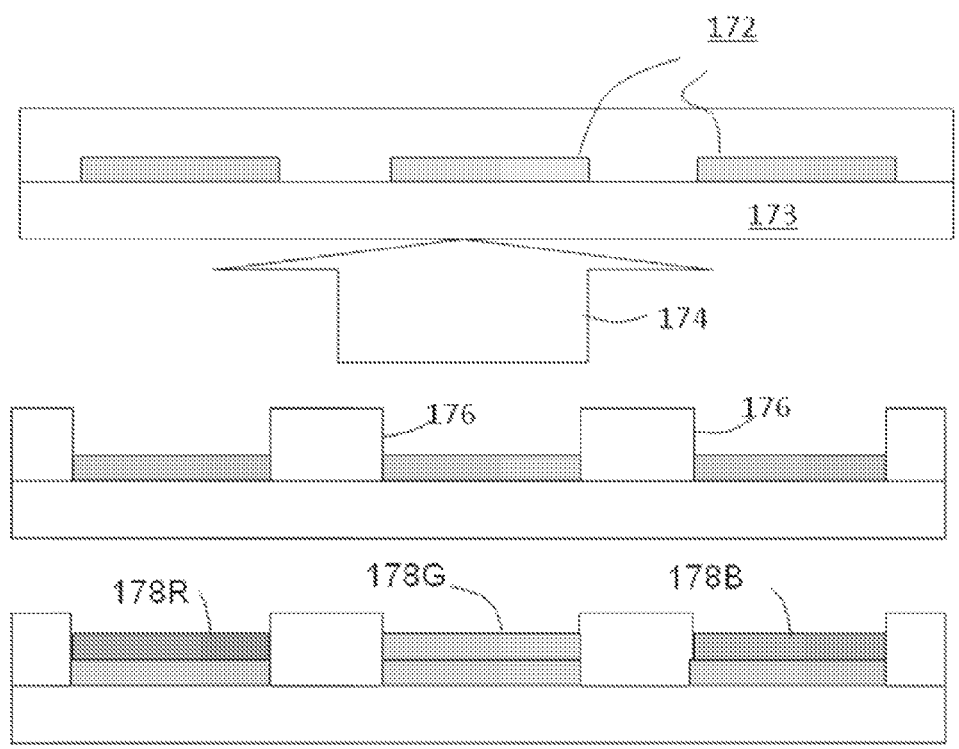
FIG. 17 shows a manufacturing process of the invention.

An embodiment of the process described above is shown in FIG. 17.

In the top image, sub-wavelength size emitting electrodes 1720 are patterned adjacent to each other—preferably in a single mask step and on a planarized substrate layer 173. The layer can be either a metal layer (for e.g. a top-emitting OLED structure) or a thin, non-transparent top layer (such as Al on ITO) if a bottom emitting OLED structure is preferred. This non-transparency is needed so that the layer can be used as an exposure mask, but it then needs to be removed before the solution processing of the OLED/PLED. This removal may not be necessary if ITO is used, as ITO is only partially transparent at the shorter wavelengths used for the exposure process.

As the electrode layer is used as a mask to expose the photo-resist, it should be of the negative type (i.e. the pattern remains where it is exposed with light). The exposure is shown as arrow 174.

After development of the photoresist, only the resist between the emitter electrodes 172 remains. These photoresist portions form the required dams 176. If required, the dams 176 may be further reduced in size by a subsequent etching of the dams.

Different colored OLED/PLED structures 178R, 178G and 178B (for red, green and blue LEDs) are then formed in adjacent sub-wavelength sized areas using solution processing, for example inkjet printing.

Thus, the emitter electrodes are used as a mask for dam formation, which separates the light emitting areas.

Figure 11B:
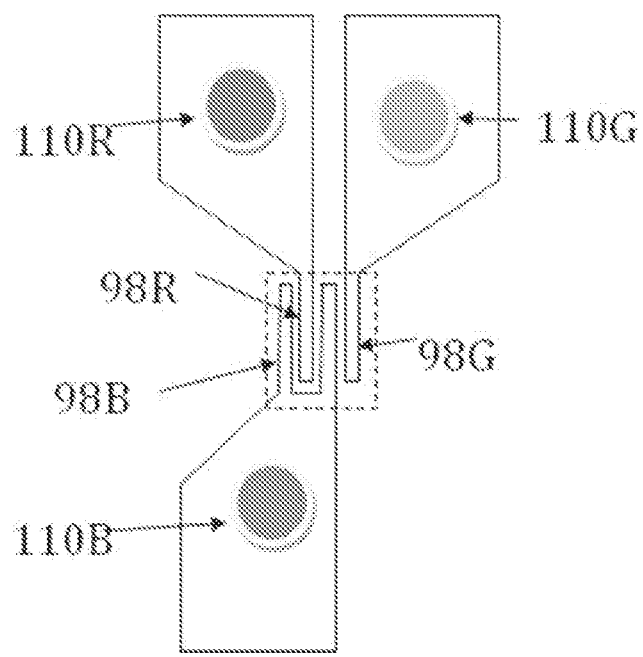
FIG. 11B shows how the process can enable simpler inkjet printhead alignment.

As mentioned above, it is useful to provide at least a portion of the area within the dam with a larger dimension (typically in excess of 10 microns) in order to facilitate easy alignment of the inkjet printing head with the display substrate over the entire area of the substrate. This may be realized by using the dams to create areas with a larger dimension but not overlapping the emitting electrodes, with "finger like" sub-wavelength sized areas overlapping the emitting electrodes. This is illustrated in FIG. 11B.

Each set of light emitting areas of a color lead to a landing area 110R, 110G, 110B, which are coupled to the respective sub-pixels 98R, 98G, 98B. During the printing process, the OLED/PLED solution is inkjetted into the larger landing areas, and spreads into the sub-wavelength sized areas overlapping the emitting electrodes as the surface is wetted.

The process allows striped patterns to be formed as is shown in FIG. 11A.

When light emitting pixels are used, the light emissive area can be a fraction of the area of the display due to the high brightness. Thus, the printing pads 110 can be provided within the single pixel area.

The invention can be applied to all 3D displays, such as living room TV, mobile phones and medical applications. The invention overcomes the problem of visible color break up which results in known systems when the different color components of individual pixels are visibly output at discrete positions.

It will be apparent that there will be many more light emitting areas or if there is only one per sub-pixel many more sub-pixels than in conventional displays. For example, with the smaller pixel pitch of 100 micrometer for a mobile phone, and assuming the light emitting area of the pixel occupies 10% of the pixel area (the other 90% taken up with printing pads and conductor lines other than the emitter electrode), a light emitting area of 10 micrometer×10 micrometer results, into which 50 vertical stripes can fit with width 200 nanometer. For an array of square 200 nanometer light emitting areas or sub-pixels, there would be 50×50=2500 light emitting areas per pixel. Thus, there may be more than 50 light emitting areas per pixel in the panel or device of the invention, or alternatively there may be more than 100 or more than 200 light emitting areas per pixel. This shows the difference in design compared to the prior art resulting from the implementation of embodiments of the invention.

The invention essentially provides a modification to the light emitting area distribution and optionally sub-pixel layout of a display, but all other aspects remain the same. Thus, the invention can be applied to the display configuration shown in FIG. 6 although preferably with an LED underlying display rather than the backlight and LCD of FIG. 6. For this reason, the other details of the display system have not been described in detail.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A display panel comprising an array of pixels, each pixel comprising a first sub-pixel which comprises a plurality of first light emitting areas for providing light of a first color distributed over the entire pixel area and a second sub-pixel which comprises a plurality of second light emitting areas distributed over the entire pixel area for providing light of a second color different from the first color, the first and second light emitting areas being separated from each other by a first spacing along a first spacing axis perpendicular to a normal of the panel,
wherein the first spacing is greater than 0 but less then than 5 micrometer, or smaller than 3 micrometer, or smaller than 1.5 micrometer, or equal to, or smaller than 0.5 micrometer; and wherein the first spacing is proportional to a wavelength of light emitted by the display panel,
and wherein the light emitting areas of the first subpixel are interconnected such that they are simultaneously addressable with one interconnect line and/or the light emitting areas of the second sub-pixel are interconnected such that they are simultaneously addressable with one interconnect line.

2. A panel as claimed in claim 1, wherein the first light emitting areas and/or the second light emitting areas each have a width along the first spacing axis, the width greater than 0 but less than 5 micrometer.

3. A 3D display device as claimed in claim 1, wherein the panel further comprises a third light emitting area for providing light of a third color, the third light emitting areas being separated from the first light emitting area by a second spacing along a second spacing axis perpendicular to a normal of the panel, wherein the second spacing is greater than 0 but less than 5 micrometer.

4. A panel as claimed in claim 3 wherein the first spacing axis and the second spacing axis are parallel to each other and wherein the second light emitting areas are at least partly in between the first and third light emitting areas.

5. A panel according to claim 3, wherein each pixel further comprising a fourth sub-pixel comprising a plurality of fourth light emitting areas distributed over the entire pixel area for providing light of a fourth color and a fifth sub-pixel comprising a plurality of fifth light emitting areas distributed over the entire pixel area for providing light of a fifth color, wherein the fourth light emitting areas are separated from the second light emitting areas with a third spacing along a third spacing axis, wherein the fifth light emitting areas are separated from the fourth light emitting areas with a fourth spacing along a fourth spacing axis, the third spacing axis and the fourth spacing axis being perpendicular to the normal of the panel and mutually parallel, the fourth spacing axis enclosing a non-zero angle with at least one of the first spacing axis and the second spacing axis, wherein the second light emitting areas are at least partly in between the fourth light emitting areas and the fifth light emitting areas, and wherein the third spacing and the fourth spacing are greater than 0 but less than 5 micrometer, or smaller than 3 micrometer, or smaller than 1.5 micrometer, or the same as, or smaller than 0.5 micrometer.

6. A panel according to claim 5, wherein at least the first light emitting areas, the third light emitting areas and the fourth light emitting areas are for providing light of the same color.

7. A 3D display device according to claim 3, wherein at least the first color, the second color and the third color are mutually different colors.

8. A 3D display device according to claim 3, wherein at least the first color and the third color are the same color.

9. A panel according to claim 1, wherein the light emitting areas have any one of a triangular, quadrangular, or hexagonal shape.

10. A panel as claimed in claim 1 further comprising a magnification arrangement for magnifying the light emitting areas of the panel.

11. A panel as claimed in claim 1 wherein each pixel covers a single continuous area of the panel.

12. A panel as claimed in claim 1, wherein a pixel covers at least a first continuous area of the panel and a second continuous panel area such that the first continuous panel area is not contiguous with the second continuous panel area, and wherein the first continuous panel area and the second continuous panel area each comprise a first light emitting area of the first sub-pixel and a second light emitting area of the second sub-pixel.

13. A panel as claimed in claim 1 wherein the first continuous panel area and/or the second continuous panel area comprise a plurality of first and/or second light emitting areas.

14. A panel as claimed in claim 1 wherein the light emitting areas of each of the first sub-pixel and the second sub-pixel that are covered by the first continuous panel area of a pixel are interconnected such that they are simultaneously addressable with one interconnect line and wherein the light emitting areas of each of the first sub-pixel and the second sub-pixel covered by the second continuous area of the pixel are interconnected such that they are simultaneously addressable with one interconnect line.

15. A display device comprising the panel as claimed in claim 1.

16. A display device as claimed in claim 15, wherein the display device is a multi-view display device.

17. A display device as claimed in claim 16, the display device further comprising a view forming arrangement for providing at least two views within a field of view of the display device, the view forming arrangement being capable of directing the light output of a first subset of the pixels into a first view and a second subset of pixels that is different from the first subset of pixels into the second view.

18. A display device as claimed in claim 17, wherein the view forming arrangement is switchable between a first mode in which it possesses the view forming function and a second mode in which it lacks the view forming function.

19. A display device as claimed in claim 16 wherein the view forming arrangement comprises lenticular lenses at least in the view forming mode.

20. A panel as claimed in claim 1, wherein the first and second light emitting areas have a feature size which is greater than 0 but less than 5 micrometer, or smaller than 3 micrometer, or smaller than 1.5 micrometer, or equal to, or smaller than 0.5 micrometer.

* * * * *